US010439103B2

(12) United States Patent
Uzawa et al.

(10) Patent No.: US 10,439,103 B2
(45) Date of Patent: Oct. 8, 2019

(54) LIGHT-EMITTING DIODE AND METHOD FOR MANUFACTURING TUNNEL JUNCTION LAYER

(71) Applicant: SHOWA DENKO K. K., Tokyo (JP)

(72) Inventors: Akira Uzawa, Chichibu (JP); Noriyoshi Seo, Chichibu (JP); Atsushi Matsumura, Chichibu (JP); Noriyuki Aihara, Chichibu (JP)

(73) Assignee: SHOWA DENKO K. K., Tokyo (JP)

( * ) Notice: Subject to any disclaimer, the term of this patent is extended or adjusted under 35 U.S.C. 154(b) by 0 days.

(21) Appl. No.: 15/981,988

(22) Filed: May 17, 2018

(65) Prior Publication Data

US 2018/0342646 A1    Nov. 29, 2018

(30) Foreign Application Priority Data

May 25, 2017    (JP) ................................. 2017-103197
Feb. 2, 2018     (JP) ................................. 2018-017456

(51) Int. Cl.
*H01L 33/06*      (2010.01)
*H01L 33/00*      (2010.01)
(Continued)

(52) U.S. Cl.
CPC .......... *H01L 33/06* (2013.01); *H01L 33/0062* (2013.01); *H01L 33/30* (2013.01);
(Continued)

(58) Field of Classification Search
None
See application file for complete search history.

(56) References Cited

U.S. PATENT DOCUMENTS

| 9,905,725 B2 * | 2/2018 | Lee ..................... H01L 33/06 |
| 2004/0066816 A1 | 4/2004 | Collins, III et al. |

(Continued)

FOREIGN PATENT DOCUMENTS

| JP | 2009-522755 A | 6/2009 |
| TW | 200417057 A | 9/2004 |

(Continued)

OTHER PUBLICATIONS

Enrique Barrigon et al., "Highly conductive p++-AlGaAs/n++-GaInP tunnel junctions for ultra-high concentrator solar cells", Progress in Photovoltaics: Research and Applications, 2014, vol. 22, pp. 399-404 (6 pages total).

(Continued)

*Primary Examiner* — Dung A. Le
(74) *Attorney, Agent, or Firm* — Sughrue Mion, PLLC

(57) ABSTRACT

A light-emitting element layer 10 includes: an n-type contact layer 11; a first light-emitting layer 12; a tunnel junction layer 13; a second light-emitting layer 14; and a p-type contact layer 15 laminated in this order. The first light-emitting layer 12 and the second light-emitting layer 14 emit light of the same wavelength. The tunnel junction layer 13 includes: a p-type tunnel layer 131 made of AlGaAs containing p-type impurities (C); and an n-type tunnel layer 133 made of GaInP containing n-type impurities (Te). A highly n-type impurities-doped layer 132 having a higher concentration of n-type impurities than the n-type tunnel layer 133 is arranged between the p-type tunnel layer 131 and the n-type tunnel layer 133.

13 Claims, 11 Drawing Sheets

(51) Int. Cl.
*H01L 33/30* (2010.01)
*H01L 33/40* (2010.01)
*H01L 33/04* (2010.01)
*H01L 33/08* (2010.01)

(52) U.S. Cl.
CPC ............ *H01L 33/405* (2013.01); *H01L 33/04* (2013.01); *H01L 33/08* (2013.01)

(56) References Cited

U.S. PATENT DOCUMENTS

| | | |
|---|---|---|
| 2009/0146132 A1 | 6/2009 | Lee et al. |
| 2009/0173961 A1 | 7/2009 | Windisch et al. |
| 2010/0229930 A1 | 9/2010 | Fetzer |
| 2011/0186815 A1 | 8/2011 | Lee et al. |
| 2011/0278641 A1 | 11/2011 | Groiler et al. |
| 2013/0015425 A1 | 1/2013 | Lin et al. |
| 2013/0075696 A1 | 3/2013 | Hsieh et al. |
| 2013/0299778 A1* | 11/2013 | Okuno ................... H01L 33/04 257/13 |
| 2015/0060877 A1 | 3/2015 | Liu et al. |
| 2017/0338369 A1* | 11/2017 | Wildeson ................ H01L 33/02 |
| 2018/0006187 A1 | 1/2018 | Liu et al. |

FOREIGN PATENT DOCUMENTS

| | | |
|---|---|---|
| TW | 200926455 A | 6/2009 |
| TW | 201304188 A | 1/2013 |
| TW | 201508945 A | 3/2015 |
| WO | 2007/076796 A1 | 7/2007 |

OTHER PUBLICATIONS

S. M. Bedair et al., "A New GaAsP—InGaAs Strained-Layer Super-lattice Light-Emitting Diode", IEEE Electron Device Letters, Feb. 1984, vol. EDL-5, No. 2, pp. 45-47.

Chong-Yi Lee et al., "Comparison of single- and double-heterostructure AlGaAs/InGaP red light-emitting diodes prepared by liquid-phase epitaxy", J. Appl. Phys., Apr. 15, 1992, vol. 71, No. 8, pp. 3940-3944 (6 pages total).

C. Ebert et al., "Tellurium doping of InGaP for tunnel junction applications in triple junction solar cells", Journal of Crystal Growth, 2011, vol. 315, pp. 61-63 (4 pages total).

Xia Guo et al., "High efficiency tunneling-regenerated multi-active region light-emitting diodes", Proceedings of SPIE, 2000, pp. 170-179 (12 pages total).

German Office Action dated Jan. 11, 2019, issued by the German Patent and Trademark Office in application No. 10 2018 112 228.4.

* cited by examiner

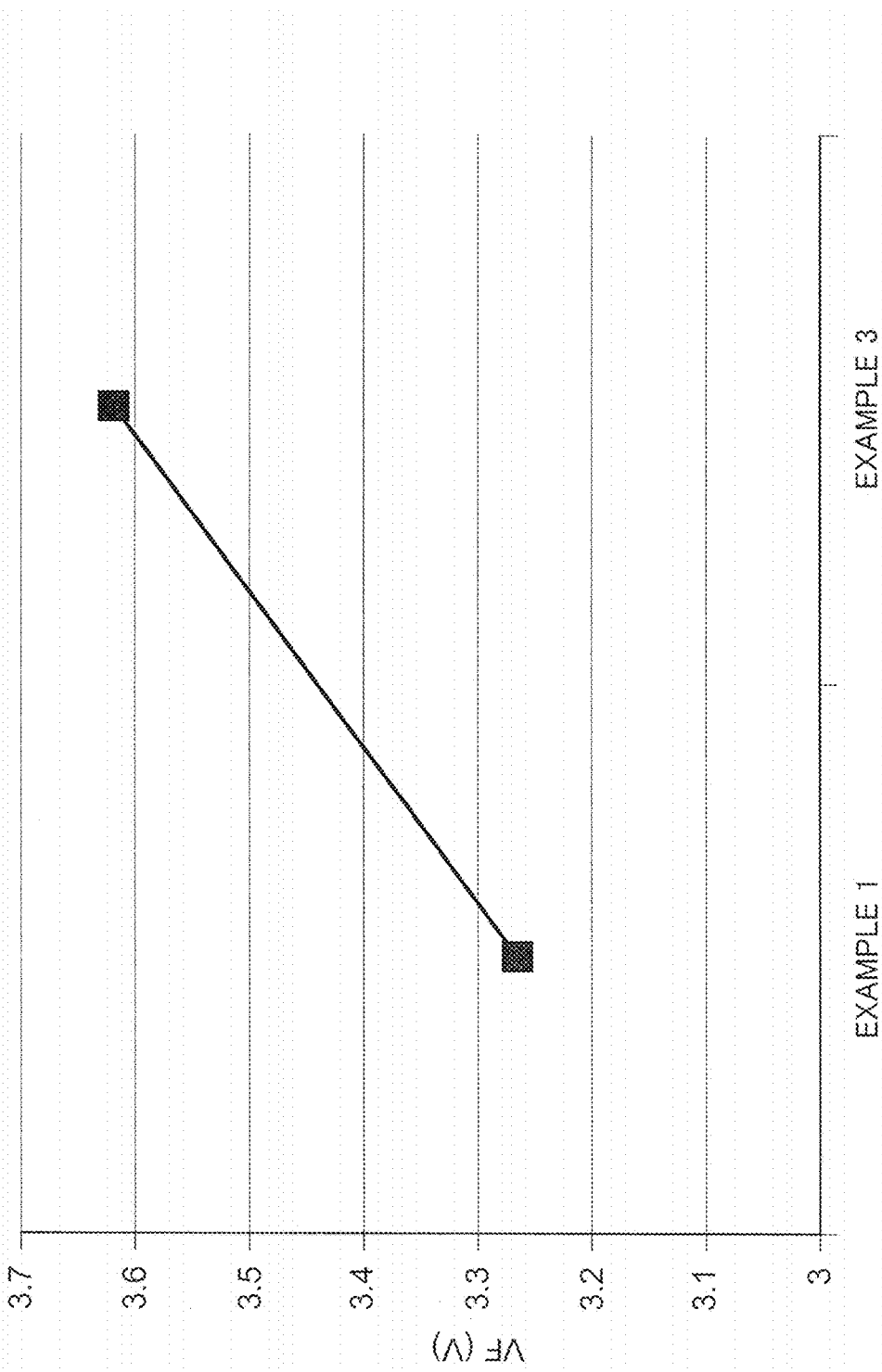

LIGHT-EMITTING DIODE AND METHOD FOR MANUFACTURING TUNNEL JUNCTION LAYER

CROSS REFERENCE TO RELATED APPLICATIONS

This application is based on and claims priority under 35 USC § 119 from Japanese Patent Application No. 2017-103197 filed May 25, 2017 and Japanese Patent Application No. 2018-017456 filed Feb. 2, 2018.

BACKGROUND

Technical Field

The present invention relates to a light-emitting diode and a method for manufacturing a tunnel junction layer.

Related Art

A light-emitting diode has been widely known that includes a p-type semiconductor layer containing p-type impurities, an n-type semiconductor layer containing n-type impurities, and an active layer sandwiched between the p-type semiconductor layer and the n-type semiconductor layer and having a smaller band gap than the p-type semiconductor layer and the n-type semiconductor layer.

Japanese Patent Application Laid-Open Publication No. 2009-522755 discloses a light-emitting diode that includes a first radiation-generating active layer and a second radiation-generating active layer being arranged one above another in a vertical direction. The first radiation-generating active layer includes a p-type semiconductor layer, an active layer (a radiation-generating layer) and an n-type semiconductor layer, and emits incoherent light. The second radiation-generating active layer includes a p-type semiconductor layer, an active layer (a radiation-generating layer) and an n-type semiconductor layer, and emits light of a similar wavelength to that of the first radiation-generating active layer. The light-emitting diode further includes a tunnel junction layer formed between the first radiation-generating active layer and the second radiation-generating active layer.

By adopting a configuration where plural light-emitting parts are laminated one above another across a tunnel junction layer, a forward current can be supplied to the plural light-emitting parts connected in series across the tunnel junction layer. This enables each of the plural light-emitting parts to emit light.

However, adopting this configuration may reduce light emission output of the light-emitting diode because, in some cases, a part of the light emitted from each light-emitting part cannot be extracted to the outside of the light-emitting diode.

An object of the present invention is to improve light emission output of a light-emitting diode that is composed of plural light-emitting parts being laminated one above another across a tunnel junction part.

SUMMARY

According to an aspect of the present invention, a light-emitting diode includes: a first light-emitting part including a first p-type layer, a first n-type layer, and a first active layer, the first p-type layer containing a compound semiconductor and p-type impurities, the first n-type layer containing a compound semiconductor and n-type impurities, the first active layer containing a compound semiconductor and being sandwiched between the first p-type layer and the first n-type layer; a second light-emitting part including a second p-type layer, a second n-type layer, and a second active layer, the second p-type layer containing a compound semiconductor and p-type impurities, the second n-type layer containing a compound semiconductor and n-type impurities, the second active layer containing a compound semiconductor and being sandwiched between the second p-type layer and the second n-type layer, the second light-emitting part emitting light of the same wavelength as the first light-emitting part; and a tunnel junction part including a third p-type layer and a third n-type layer, the third p-type layer facing the first p-type layer and containing $Al_xGa_{1-x}As$ ($0 \leq x \leq 0.3$) and p-type impurities, the third n-type layer facing the second n-type layer and containing $(Al_xGa_{1-x})_yIn_{1-y}P$ ($0 \leq x \leq 0.2$, $0.4 \leq y \leq 0.6$) and n-type impurities, the tunnel junction part being sandwiched between the first light-emitting part and the second light-emitting part, the third p-type layer and the third n-type layer forming a tunnel junction.

In the light-emitting diode, the tunnel junction part further includes a highly n-type impurities-doped layer at a boundary between the third p-type layer and the third n-type layer, the highly n-type impurities-doped layer containing n-type impurities at a higher concentration than the third n-type layer.

Further, the highly n-type impurities-doped layer is thinner than the third n-type layer and the third p-type layer.

Further, concentration of the n-type impurities in the highly n-type impurities-doped layer is not less than $1 \times 10^{20}$ $cm^{-3}$ and not more than $1 \times 10^{21}$ $cm^{-3}$.

Further, concentration of the n-type impurities in the third n-type layer is higher at a side facing the third p-type layer than at a side facing the second n-type layer.

Further, concentration of the p-type impurities in the third p-type layer is higher at a side facing the third n-type layer than at a side facing the first p-type layer.

Further, both of the first active layer and the second active layer have a single- or multi-quantum well structure including a well layer and a barrier layer, the well layer is composed of $(Al_xGa_{1-x})_yIn_{1-y}As_zP_{1-z}$ ($0 \leq x \leq 0.2$, $0.7 \leq y \leq 1.0$, $0.7 \leq z \leq 1.0$), and the barrier layer is composed of $Al_xGa_{1-x}As_zP_{1-z}$ ($0 \leq x \leq 0.3$, $0.7 \leq z \leq 1.0$).

Further, each of the first p-type layer, the second p-type layer and the third p-type layer contains C as p-type impurities, and each of the first n-type layer, the second n-type layer and the third n-type layer contains Te as n-type impurities.

According to another aspect of the present invention, a light-emitting diode includes: a first light-emitting part including a first p-type layer, a first n-type layer, and a first active layer, the first p-type layer containing Al, Ga, As and p-type impurities, the first n-type layer containing Al, Ga, As and n-type impurities, the first active layer containing a group III-V semiconductor and being sandwiched between the first p-type layer and the first n-type layer; a second light-emitting part including a second p-type layer, a second n-type layer, and a second active layer, the second p-type layer containing Al, Ga, As and p-type impurities, the second n-type layer containing Al, Ga, As and n-type impurities, the second active layer containing a group III-V semiconductor and being sandwiched between the second p-type layer and the second n-type layer, the second light-emitting part emitting light of the same wavelength as the first light-emitting part; and a tunnel junction part including a third p-type layer and a third n-type layer, the third p-type layer facing the first p-type layer and containing Ga, As and p-type impurities, the third n-type layer facing the second n-type layer and containing Ga, In, P and n-type impurities, the tunnel junction part being sandwiched between the first light-emitting part and the second light-emitting part, the third p-type layer and the third n-type layer forming a tunnel junction.

In the light-emitting diode, the third n-type layer has a larger band gap than the third p-type layer.

Further, the first p-type layer and the second n-type layer have a common composition except for contained impurities.

Further, each of the third p-type layer and the third n-type layer is composed of a direct band gap semiconductor.

Further, concentration of the n-type impurities in the third n-type layer is not less than $1 \times 10^{20}$ cm$^{-3}$ and not more than $1 \times 10^{21}$ cm$^{-3}$.

According to still another aspect of the present invention, a method for manufacturing a tunnel junction layer using organic vapor phase deposition, includes: a first process that supplies a first material gas containing a group III element, a second material gas containing a group V element, and a third material gas containing a dopant of a first conductivity type, onto a compound semiconductor layer on which the tunnel junction layer is to be laminated; a second process that stops supplying the first material gas, the second material gas and the third material gas, and supplies a fourth material gas containing a dopant of a second conductivity type opposite to the first conductivity type; and a third process that continues to supply the fourth material gas, and further supplies a fifth material gas containing a group III element and a sixth material gas containing a group V element.

In the method for manufacturing a tunnel junction layer, the first material gas contains Al and Ga as group III elements, the second material gas contains As as a group V element, the third material gas contains C as a dopant of the first conductivity type, the fourth material gas contains Te as a dopant of the second conductivity type, the fifth material gas contains Ga and In as group III elements, and the sixth material gas contains P as a group V element.

Further, the compound semiconductor layer on which the tunnel junction layer is to be laminated contains Al, Ga, and As.

Further, the first process increases a flow rate of the third material gas with a lapse of time, and the third process decreases a flow rate of the fourth material gas with a lapse of time.

Further, a temperature of an object on which the tunnel junction layer is to be laminated is lowered by 100 C° to 150 C° before starting the first process, and, after finishing the third process, the temperature of the object on which the tunnel junction layer has been laminated is increased by 100 C° to 150 C°.

According to the present invention, it is possible to improve light emission output of a light-emitting diode that is composed of plural light-emitting parts being laminated one above another across a tunnel junction part.

BRIEF DESCRIPTION OF THE DRAWINGS

An exemplary embodiment of the present invention will be described in detail based on the following figures, wherein:

FIG. 10 is a diagram illustrating a relationship between forward voltages of the semiconductor light-emitting elements of the Examples 1 and 3.

DETAILED DESCRIPTION

Figure 1:
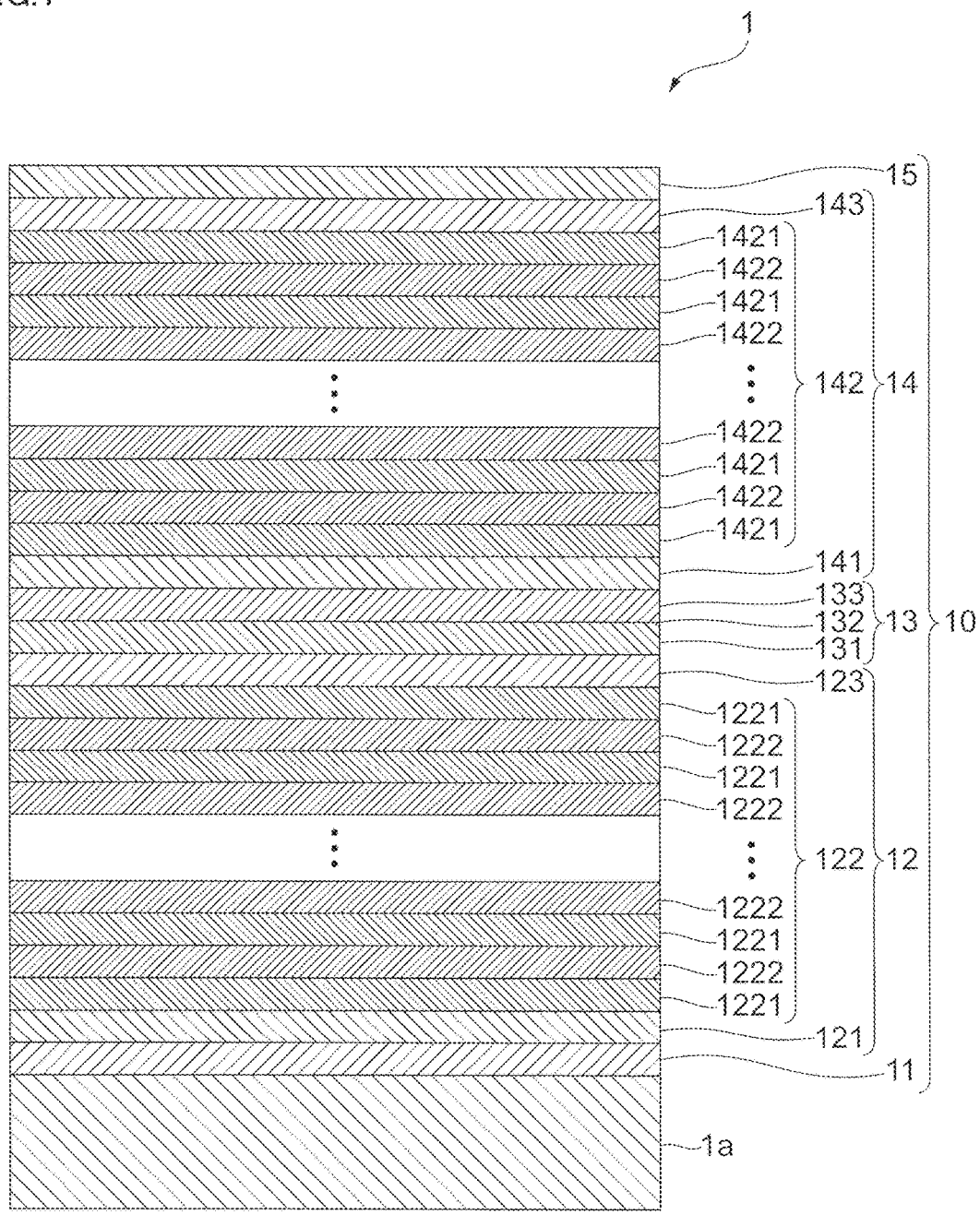
FIG. 1 is a diagram illustrating a cross-sectional structure of a semiconductor layer forming substrate according to the exemplary embodiment.

Hereinafter, the exemplary embodiment according to the present invention will be described in detail with reference to attached drawings. It should be noted that size, thickness, etc. of the parts in the drawings to be referred to in the following description may differ from actual dimensions. It should also be noted that, in the following description, group III-V semiconductors consisting of three or more elements may be referred to with the composition ratio of each element being omitted (e.g. "AlGaInAsP").

<Structure of the Semiconductor Layer Forming Substrate>

FIG. 1 is a diagram illustrating a cross-sectional structure of the semiconductor layer forming substrate 1 according to the exemplary embodiment.

The semiconductor layer forming substrate 1 includes: a growth substrate 1a; and a light-emitting element layer 10 that is composed of plural semiconductor layers laminated on the growth substrate 1a and emits light by passing a current. Although details are described later, the light-emitting element layer 10 functions as a so-called double-stacked light-emitting diode, which is formed by stacking plural light-emitting layers (light-emitting diodes) each having a p-n junction, and arranging, between the light-emitting layers, a tunnel junction layer (a tunnel diode) that passes a current in a reverse direction (from an n-type layer to a p-type layer) by a tunnel effect.

[Growth Substrate]

The growth substrate 1a of the exemplary embodiment is composed of a single crystal of a compound semiconductor (a group III-V semiconductor). For example, the growth substrate 1a of this kind may be GaAs and InP.

[Light-Emitting Element Layer]

The light-emitting element layer 10 includes: an n-type contact layer 11 laminated on the growth substrate 1a; a first light-emitting layer 12 laminated on the n-type contact layer 11; a tunnel junction layer 13 laminated on the first light-emitting layer 12; a second light-emitting layer 14 laminated on the tunnel junction layer 13; and a p-type contact layer 15 laminated on the second light-emitting layer 14. Hereinafter, components of the light-emitting element layer 10 will be described one by one.

(N-Type Contact Layer)

The n-type contact layer 11, in which electrons are carriers, is a layer for providing an n-electrode (not shown; a negative electrode portion 30; see FIG. 5 described later). The n-type contact layer 11 of the exemplary embodiment is composed of a compound semiconductor (a group III-V semiconductor) that lattice-matches a surface (growth surface) of the growth substrate 1a.

The n-type contact layer 11 is preferably doped with n-type impurities. Containing n-type impurities at a concentration of $5\times10^{17}$ cm$^{-3}$ to $2\times10^{19}$ cm$^{-3}$ is preferable in that an increase in resistance can be prevented and deterioration of crystallinity is less likely to occur. The n-type impurities may be, but not limited to, Te, Si or Se.

(First Light-Emitting Layer)

The first light-emitting layer 12, which is an example of the first light-emitting part, has a so-called double hetero junction and a quantum well structure, and emits light by passing a current.

The first light-emitting layer 12 of the exemplary embodiment includes: a first n-type cladding layer 121 laminated on the n-type contact layer 11; a first active layer 122 laminated on the first n-type cladding layer 121; and a first p-type cladding layer 123 laminated on the first active layer 122. Further, the first active layer 122 includes plural first well layers 1221 and plural first barrier layers 1222 alternately laminated on each other.

[First n-Type Cladding Layer]

The first n-type cladding layer 121, which is an example of the first n-type layer, injects carriers (holes and electrons) into the first active layer 122 and confines the carriers, together with the first p-type cladding layer 123. The first n-type cladding layer 121 of the exemplary embodiment is composed of a compound semiconductor (a group III-V semiconductor) that lattice-matches the n-type contact layer 11.

The first n-type cladding layer 121 preferably has a larger band gap than the n-type contact layer 11.

Further, the first n-type cladding layer 121 is preferably doped with n-type impurities. Containing n-type impurities at a concentration of $5\times10^{17}$ cm$^{-3}$ to $1\times10^{19}$ cm$^{-3}$ is preferable in that carriers are more effectively injected into the first active layer 122 having a quantum well structure, and light absorption by carries within the first n-type cladding layer 121 can be reduced. Here, the first n-type cladding layer 121 preferably contains the same n-type impurities as the n-type contact layer 11.

[First Active Layer]

The first active layer 122 emits light through recombination of holes and electrons. The first active layer 122 of the exemplary embodiment has a so-called multi-quantum well (MQW) structure formed by alternately stacking the first well layers 1221 and the first barrier layers 1222. Note that the first active layer 122 (the first well layers 1221 and the first barrier layers 1222) basically does not contain n-type impurities and p-type impurities. However, during the manufacturing of the first active layer 122, n-type impurities and p-type impurities may be diffused from the first n-type cladding layer 121 and the first p-type cladding layer 123, respectively, to the first active layer 122.

{First Well Layer}

The first well layer 1221, which is an example of the well layer, is sandwiched by two adjacent first barrier layers 1222. However, in this example, the first well layer 1221 located lowermost in the figure (at the side of the first n-type cladding layer 121) is sandwiched by the first n-type cladding layer 121 and the first barrier layer 1222. Also, in this example, the first well layer 1221 located uppermost in the figure (at the side of the first p-type cladding layer 123) is sandwiched by the first p-type cladding layer 123 and the first barrier layer 1222. Accordingly, in this example, the number of the first well layers 1221 is larger than the number of the first barrier layers 1222 by one. The first well layer 1221 of the exemplary embodiment is composed of a compound semiconductor (a group III-V semiconductor) that lattice-matches the first n-type cladding layer 121 and the first p-type cladding layer 123. The first well layer 1221 is preferably composed of $(Al_xGa_{1-x})_yIn_{1-y}As_zP_{1-z}$ ($0 \leq x \leq 0.2$, $0.7 \leq y \leq 1.0$, $0.7 \leq z \leq 1.0$). Also, the first well layer 1221 is preferably composed of a direct band gap compound semiconductor (group III-V semiconductor).

The first well layer 1221 preferably has a smaller film thickness than the first n-type cladding layer 121 and the first p-type cladding layer 123. Additionally, the first well layer 1221 preferably has a smaller band gap than the first n-type cladding layer 121 and the first p-type cladding layer 123.

{First Barrier Layer}

The first barrier layer 1222, which is an example of the barrier layer, sandwiches the first well layer 1221 together with an adjacent first barrier layer 1222. The first barrier layer 1222 of the exemplary embodiment is composed of a compound semiconductor (a group III-V semiconductor) that lattice-matches the first well layer 1221. The first barrier layer 1222 is preferably composed of $Al_xGa_{1-x}As_zP_{1-z}$ ($0 \leq x \leq 0.3$, $0.7 \leq z \leq 1.0$). Also, the first barrier layer 1222 is preferably composed of a direct band gap compound semiconductor (group III-V semiconductor).

The first barrier layer 1222 preferably has a smaller film thickness than the first n-type cladding layer 121 and the first p-type cladding layer 123. Also, the first barrier layer 1222 preferably has a larger film thickness than the first well layer 1221. Additionally, the first barrier layer 1222 preferably has a smaller band gap than the first n-type cladding layer 121 and the first p-type cladding layer 123. Further, the first barrier layer 1222 preferably has a larger band gap than the first well layer 1221.

[First p-Type Cladding Layer]

The first p-type cladding layer 123, which is an example of the first p-type layer or a compound semiconductor layer, injects carriers into the first active layer 122 and confines the carriers, together with the first n-type cladding layer 121. The first p-type cladding layer 123 of the exemplary embodiment is composed of a compound semiconductor (a group III-V semiconductor) that lattice-matches the first well layer 1221.

The first p-type cladding layer 123 preferably has the same film thickness as the first n-type cladding layer 121. Also, the first p-type cladding layer 123 preferably has the same band gap as the first n-type cladding layer 121.

Further, the first p-type cladding layer 123 is preferably doped with p-type impurities. Containing p-type impurities at a concentration of $1\times10^{17}$ cm$^{-3}$ to $5\times10^{18}$ cm$^{-3}$ is preferable in that carriers are more effectively injected into the first active layer 122 having a quantum well structure, and light absorption by carries within the first p-type cladding layer 123 can be reduced. The p-type impurities may be, but not limited to, C, Mg or Zn. The concentration of the p-type impurities in the first p-type cladding layer 123 is preferably lower than the concentration of the n-type impurities in the first n-type cladding layer 121. Additionally, the first p-type cladding layer 123 preferably has the same composition as the first n-type cladding layer 121, except for the contained impurities.

(Tunnel Junction Layer)

The tunnel junction layer 13, which is an example of the tunnel junction part, connects the first light-emitting layer 12 and the second light-emitting layer 14. By use of its own tunnel junction, the tunnel junction layer 13 passes a forward current through the first light-emitting layer 12 and the second light-emitting layer 14, which are connected in series across the tunnel junction layer 13, in a direction from the second light-emitting layer 14 to the first light-emitting layer 12.

The tunnel junction layer 13 includes: a p-type tunnel layer 131 laminated on the first p-type cladding layer 123 of the first light-emitting layer 12; and an n-type tunnel layer 133 on which a second n-type cladding layer 141 (details described later) of a second light-emitting layer 14 is laminated. The tunnel junction layer 13 further includes a highly n-type impurities-doped layer 132 between the p-type tunnel layer 131 and the n-type tunnel layer 133. Thus, the tunnel junction layer 13 of the exemplary embodiment includes the p-type tunnel layer 131 laminated on the first p-type cladding layer 123, the highly n-type impurities-doped layer 132 laminated on the p-type tunnel layer 131, and the n-type tunnel layer 133 laminated on the highly n-type impurities-doped layer 132.

[P-Type Tunnel Layer]

The p-type tunnel layer 131, which is an example of the third p-type layer, forms a tunnel junction together with the n-type tunnel layer 133 and the highly n-type impurities-doped layer 132. The p-type tunnel layer 131 of the exemplary embodiment is composed of a compound semiconductor (a group III-V semiconductor) that lattice-matches the first p-type cladding layer 123 and includes at least Ga (a group III element) and As (a group V element). The p-type tunnel layer 131 is preferably composed of $Al_xGa_{1-x}As$ ($0 \leq x \leq 0.3$). Also, the p-type tunnel layer 131 is preferably composed of a direct band gap compound semiconductor (group III-V semiconductor).

The p-type tunnel layer 131 preferably has a smaller film thickness than the first p-type cladding layer 123 of the first light-emitting layer 12. Also, the p-type tunnel layer 131 preferably has a smaller band gap than the first p-type cladding layer 123 of the first light-emitting layer 12.

The p-type tunnel layer 131 is doped with p-type impurities. Here, the p-type tunnel layer 131 preferably contains the same p-type impurities as the first p-type cladding layer 123 of the first light-emitting layer 12. Additionally, the concentration of the p-type impurities in the p-type tunnel layer 131 is preferably higher than the concentration of the p-type impurities in the first p-type cladding layer 123 of the first light-emitting layer 12.

[N-Type Tunnel Layer]

The n-type tunnel layer 133, which is an example of the third n-type layer, forms a tunnel junction together with the p-type tunnel layer 131 and the highly n-type impurities-doped layer 132. The n-type tunnel layer 133 of the exemplary embodiment is composed of a compound semiconductor (a group III-V semiconductor) that lattice-matches the p-type tunnel layer 131 and includes at least Ga, In (group III elements) and P (a group V element). The n-type tunnel layer 133 is preferably composed of $(Al_xGa_{1-x})_yIn_{1-y}P$ ($0 \leq x \leq 0.2$, $0.4 \leq y \leq 0.6$). Also, the n-type tunnel layer 133 is preferably composed of a direct band gap compound semiconductor (group III-V semiconductor).

The n-type tunnel layer 133 preferably has a smaller film thickness than the p-type tunnel layer 131. Also, the n-type tunnel layer 133 preferably has a larger band gap than the p-type tunnel layer 131.

The n-type tunnel layer 133 is doped with n-type impurities. Here, the n-type tunnel layer 133 preferably contains the same n-type impurities as the first n-type cladding layer 121 of the first light-emitting layer 12. Additionally, the concentration of the n-type impurities in the n-type tunnel layer 133 is preferably higher than the concentration of the n-type impurities in the second n-type cladding layer 141 (details described later) of the second light-emitting layer 14. Further, the concentration of the n-type impurities in the n-type tunnel layer 133 is preferably lower than the concentration of the p-type impurities in the p-type tunnel layer 131.

[Highly n-Type Impurities-Doped Layer]

The highly n-type impurities-doped layer 132 is located between the p-type tunnel layer 131 and the n-type tunnel layer 133 to reduce electrical resistance of the tunnel junction layer 13. The highly n-type impurities-doped layer 132 of the exemplary embodiment is composed of a group III-V semiconductor that lattice-matches each of the p-type tunnel layer 131 and the n-type tunnel layer 133. The highly n-type impurities-doped layer 132 may contain Ga and In as group III elements and As and P as group V elements. Also, the highly n-type impurities-doped layer 132 is preferably composed of a direct band gap compound semiconductor (group III-V semiconductor).

The highly n-type impurities-doped layer 132 preferably has a smaller film thickness than the p-type tunnel layer 131. Also, the highly n-type impurities-doped layer 132 preferably has a smaller film thickness than the n-type tunnel layer 133.

The highly n-type impurities-doped layer 132 is doped with n-type impurities. Here, the highly n-type impurities-doped layer 132 preferably contains the same n-type impurities as the n-type tunnel layer 133. The concentration of the n-type impurities in the highly n-type impurities-doped layer 132 is higher than the concentration of the n-type impurities in the n-type tunnel layer 133. Further, the concentration of the n-type impurities in the highly n-type impurities-doped layer 132 is higher than the concentration of the p-type impurities in the p-type tunnel layer 131. In terms of reducing a forward voltage, the concentration of the n-type impurities in the highly n-type impurities-doped layer 132 is preferably not less than $1 \times 10^{20}$ cm$^{-3}$ and not more than $1 \times 10^{21}$ cm$^{-3}$.

Although the explanation herein is given using an example where the highly n-type impurities-doped layer 132 is present between the p-type tunnel layer 131 and the n-type tunnel layer 133, the configuration of the tunnel junction layer 13 is not limited to this. For example, the n-type tunnel layer 133 itself may contain n-type impurities at a high concentration (e.g. not less than $1 \times 10^{20}$ cm$^{-3}$ and not more than $1 \times 10^{21}$ cm$^{-3}$).

(Second Light-Emitting Layer)

The second light-emitting layer 14, which is an example of the second light-emitting part, has a so-called double hetero junction and a quantum well structure, and emits light by passing a current. In the exemplary embodiment, the second light-emitting layer 14 emits light of the same wavelength as that of the first light-emitting layer 12. Note that the "same wavelength" as used in this exemplary embodiment means that, for example, a peak emission wavelength of the second light-emitting layer 14 is in the range of ±10 nm (more preferably ±5 nm) of a peak emission wavelength of the first light-emitting layer 12. Therefore, emission peak wavelengths of the first light-emitting layer 12 and the second light-emitting layer 14 are not required to be completely identical to each other.

Although emission wavelengths of the first light-emitting layer 12 and the second light-emitting layer 14 are not limited to a specific wavelength range, the emission wavelengths are preferably in the range of red to near-infrared regions, and more preferably in the range of a near-infrared region.

The second light-emitting layer 14 may have a different structure (material, composition, thickness, impurities concentration, etc.) from the first light-emitting layer 12. However, in terms of more easily approximating the emission wavelength of the second light-emitting layer 14 to that of the first light-emitting layer 12, the second light-emitting layer 14 and the first light-emitting layer 12 preferably have a common structure. The following explanation is given using an example where the second light-emitting layer 14 and the first light-emitting layer 12 have a common structure.

The second light-emitting layer 14 of the exemplary embodiment includes: a second n-type cladding layer 141 laminated on the n-type tunnel layer 133; a second active layer 142 laminated on the second n-type cladding layer 141; and a second p-type cladding layer 143 laminated on the second active layer 142. Further, the second active layer 142 includes plural second well layers 1421 and plural second barrier layers 1422 alternately laminated on each other.

[Second n-Type Cladding Layer]

The second n-type cladding layer 141, which is an example of the second n-type layer, injects carriers (holes and electrons) into the second active layer 142 and confines the carriers, together with the second p-type cladding layer 143. The second n-type cladding layer 141 of the exemplary embodiment is composed of a compound semiconductor (a group III-V semiconductor) that lattice-matches the n-type tunnel layer 133 of the tunnel junction layer 13.

The second n-type cladding layer 141 preferably has a larger film thickness than the n-type tunnel layer 133 of the tunnel junction layer 13. Also, the second n-type cladding layer 141 preferably has a larger band gap than the n-type tunnel layer 133 of the tunnel junction layer 13.

Further, the second n-type cladding layer 141 is preferably doped with n-type impurities. Containing n-type impurities at a concentration of $5 \times 10^{17}$ cm$^{-3}$ to $1 \times 10^{19}$ cm$^{-3}$ is preferable in that carriers are more effectively injected into the second active layer 142 having a quantum well structure, and light absorption by carries within the second n-type cladding layer 141 can be reduced. Here, the second n-type cladding layer 141 preferably contains the same n-type impurities as the n-type tunnel layer 133 of the tunnel junction layer 13. The concentration of the n-type impurities in the second n-type cladding layer 141 is preferably lower than the concentration of the n-type impurities in the n-type tunnel layer 133 of the tunnel junction layer 13. Further, the second n-type cladding layer 141 preferably has the same composition as the first n-type cladding layer 121. Additionally, the second n-type cladding layer 141 preferably has the same composition as the first p-type cladding layer 123, except for the contained impurities.

[Second Active Layer]

The second active layer 142 emits light through recombination of holes and electrons. The second active layer 142 of the exemplary embodiment has a so-called multi-quantum well (MQW) structure formed by alternately stacking the second well layers 1421 and the second barrier layers 1422. Note that the second active layer 142 (the second well layers 1421 and the second barrier layers 1422) basically does not contain n-type impurities and p-type impurities. However, during the manufacturing of the second active layer 142, n-type impurities and p-type impurities may be diffused from the second n-type cladding layer 141 and the second p-type cladding layer 143, respectively, to the second active layer 142.

{Second Well Layer}

The second well layer 1421, which is an example of the well layer, is sandwiched by two adjacent second barrier layers 1422. However, in this example, the second well layer 1421 located lowermost in the figure (at the side of the second n-type cladding layer 141) is sandwiched by the second n-type cladding layer 141 and the second barrier layer 1422. Also, in this example, the second well layer 1421 located uppermost in the figure (at the side of the second p-type cladding layer 143) is sandwiched by the second p-type cladding layer 143 and the second barrier layer 1422. Accordingly, in this example, the number of the second well layers 1421 is larger than the number of the second barrier layers 1422 by one. The second well layer 1421 of the exemplary embodiment is composed of a compound semiconductor (a group III-V semiconductor) that lattice-matches the second n-type cladding layer 141 and the second p-type cladding layer 143. The second well layer 1421 is preferably composed of $(Al_xGa_{1-x})_yIn_{1-y}As_zP_{1-z}$ ($0 \leq x \leq 0.2$, $0.7 \leq y \leq 1.0$, $0.7 \leq z \leq 1.0$). Also, the second well layer 1421 is preferably composed of a direct band gap compound semiconductor (group III-V semiconductor).

The second well layer 1421 preferably has a smaller film thickness than the second n-type cladding layer 141 and the second p-type cladding layer 143. Additionally, the second well layer 1421 preferably has a smaller band gap than the second n-type cladding layer 141 and the second p-type cladding layer 143. Further, the second well layer 1421 and the first well layer 1221 preferably have a common structure.

{Second Barrier Layer}

The second barrier layer 1422, which is an example of the barrier layer, sandwiches the second well layer 1421 together with an adjacent second barrier layer 1422. The second barrier layer 1422 of the exemplary embodiment is composed of a compound semiconductor (a group III-V semiconductor) that lattice-matches the second well layer 1421. The second barrier layer 1422 is preferably composed of $Al_xGa_{1-x}As_zP_{1-z}$ ($0 \leq x \leq 0.3$, $0.7 \leq z \leq 1.0$). Also, the second barrier layer 1422 is preferably composed of a direct band gap compound semiconductor (group III-V semiconductor).

The second barrier layer 1422 preferably has a smaller film thickness than the second n-type cladding layer 141 and the second p-type cladding layer 143. Also, the second barrier layer 1422 preferably has a larger film thickness than the second well layer 1421. Additionally, the second barrier layer 1422 preferably has a smaller band gap than the second n-type cladding layer 141 and the second p-type cladding layer 143. Further, the second barrier layer 1422 preferably has a larger band gap than the second well layer 1421. The second barrier layer 1422 and the first barrier layer 1222 preferably have a common structure.

[Second p-Type Cladding Layer]

The second p-type cladding layer 143, which is an example of the second p-type layer, injects carriers into the second active layer 142 and confines the carriers, together with the second n-type cladding layer 141. The second p-type cladding layer 143 of the exemplary embodiment is composed of a compound semiconductor (a group III-V semiconductor) that lattice-matches the second well layer 1421.

The second p-type cladding layer 143 preferably has the same film thickness as the second n-type cladding layer 141. Also, the second p-type cladding layer 143 preferably has the same band gap as the second n-type cladding layer 141.

Further, the second p-type cladding layer 143 is preferably doped with p-type impurities. Containing p-type impurities at a concentration of $1 \times 10^{17}$ cm$^{-3}$ to $5 \times 10^{18}$ cm$^{-3}$ is preferable in that carriers are more effectively injected into the second active layer 142 having a quantum well structure, and light absorption by carries within the second p-type cladding layer 143 can be reduced. The second p-type cladding layer 143 preferably contains the same p-type impurities as the first p-type cladding layer 123. The concentration of the p-type impurities in the second p-type cladding layer 143 is preferably lower than the concentration of the n-type impurities in the second n-type cladding layer 141. Additionally, the second p-type cladding layer 143 preferably has the same composition as the second n-type cladding layer 141, except for the contained impurities.

(P-Type Contact Layer)

The p-type contact layer 15, in which holes are carriers, is a layer for providing a p-electrode (not shown; a positive electrode portion 20; see FIG. 5 described later). The p-type contact layer 15 of the exemplary embodiment is composed of a compound semiconductor (a group III-V semiconductor) that lattice-matches the second p-type cladding layer 143.

The p-type contact layer 15 preferably has a larger film thickness than the second p-type cladding layer 143. Also, the p-type contact layer 15 preferably has a smaller band gap than the second p-type cladding layer 143.

The p-type contact layer 15 is preferably doped with p-type impurities. Containing p-type impurities at a concentration of $5 \times 10^{17}$ cm$^{-3}$ to $2 \times 10^{19}$ cm$^{-3}$ is preferable in that an increase in resistance can be prevented and deterioration of crystallinity is less likely to occur. Further, the p-type contact layer 15 preferably contains the same p-type impurities as the second p-type cladding layer 143. Additionally, the concentration of the p-type impurities in the p-type contact layer 15 is preferably higher than the concentration of the p-type impurities in the second p-type cladding layer 143.

<Structure of the Tunnel Junction Layer>

Figure 2:
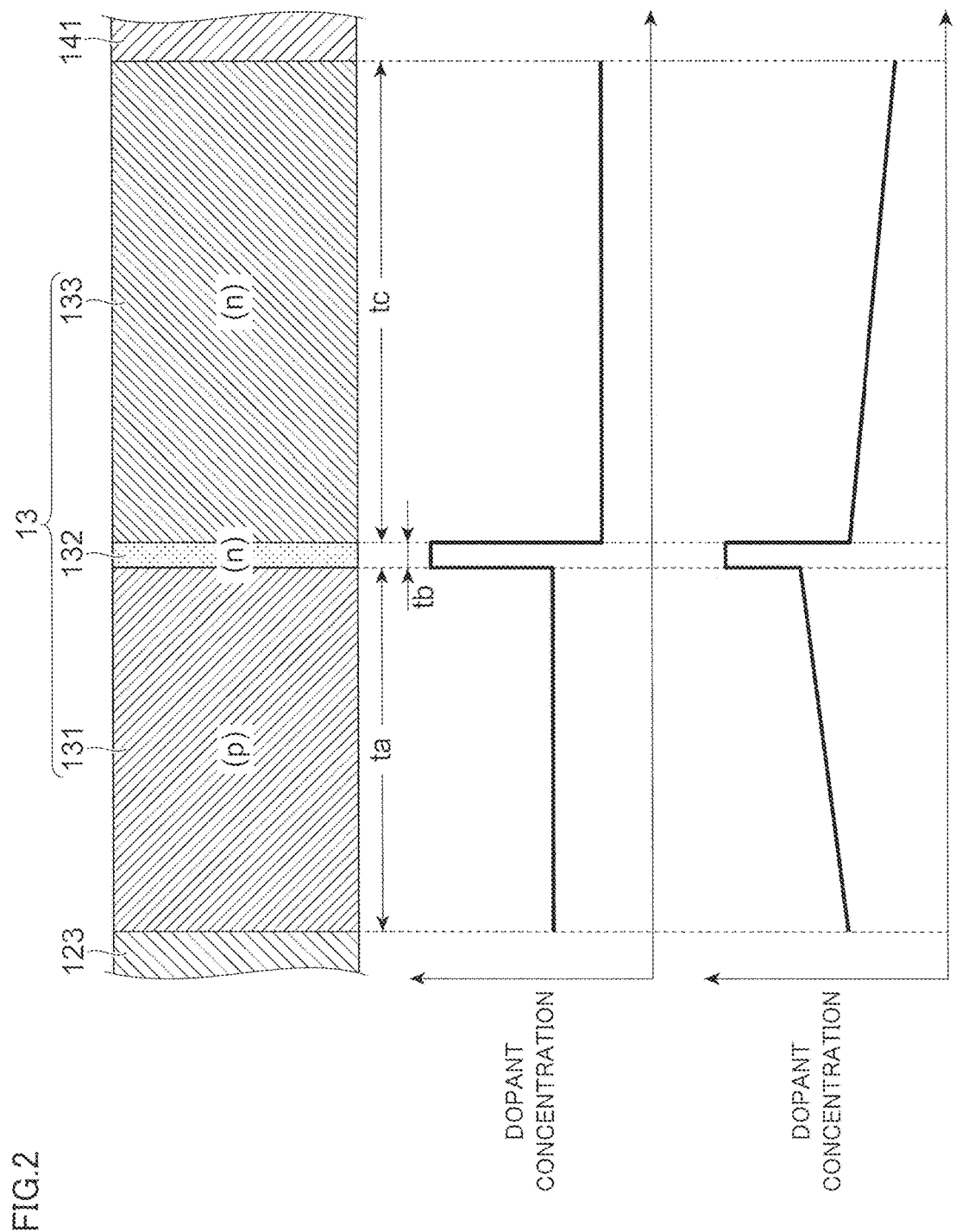
FIG. 2 is a diagram illustrating a structure around a tunnel junction layer of the semiconductor layer forming substrate.

FIG. 2 is a diagram illustrating a structure around the tunnel junction layer 13 shown in FIG. 1. In FIG. 2, the upper section represents the layer structure of the tunnel junction layer 13, the middle section represents the first example of distribution of impurity concentration (dopant concentration) in the tunnel junction layer 13, and the lower section represents the second example of distribution of impurity concentration (dopant concentration) in the tunnel junction layer 13.

[Relationship of Thickness]

As shown in the upper section in the figure, assuming that a thickness of the p-type tunnel layer 131 is referred to as a p-type tunnel layer thickness ta, a thickness of the highly n-type impurities-doped layer 132 is referred to as an n-type highly doped layer thickness tb and a thickness of the n-type tunnel layer 133 is referred to as an n-type tunnel layer thickness tc, these thicknesses preferably hold the following relationship: tb<ta, tb<tc.

[Relationship of Impurity Concentration]

As shown in the upper section in the figure, in the tunnel junction layer 13, p-type impurities (denoted by (p) in the figure) are added to the p-type tunnel layer 131, and n-type impurities (denoted by (n) in the figure) are added to the highly n-type impurities-doped layer 132 and the n-type tunnel layer 133. As shown in the middle and lower sections in the figure, the concentration of the n-type impurities in the highly n-type impurities-doped layer 132 is preferably higher than the concentration of the n-type impurities in the n-type tunnel layer 133. Also, as shown in the middle and lower sections in the figure, the concentration of the p-type impurities (dopant concentration) in the p-type tunnel layer 131 is preferably higher than the concentration of the n-type impurities (dopant concentration) in the n-type tunnel layer 133.

As shown in the first example in the middle section of the figure, the concentration of the p-type impurities in the p-type tunnel layer 131 may be substantially uniform in the thickness direction, and the concentration of the n-type impurities in the n-type tunnel layer 133 may be substantially uniform in the thickness direction. Alternatively, as shown in the second example in the lower section of the figure, the concentration of the p-type impurities in the p-type tunnel layer 131 may be higher at the boundary with the highly n-type impurities-doped layer 132 than at the boundary with the first p-type cladding layer 123, and the concentration of the n-type impurities in the n-type tunnel layer 133 may be higher at the boundary with the highly n-type impurities-doped layer 132 than at the boundary with the second n-type cladding layer 141.

Although the second example in the lower section of the figure indicates that the concentration of the p-type impurities in the p-type tunnel layer 131 and the concentration of the n-type impurities in the n-type tunnel layer 133 change linearly in the thickness direction, the concentration may change in a different manner. For example, the concentration may change curvedly or stepwise.

<Method for Manufacturing the Semiconductor Layer Forming Substrate>

Figure 3:
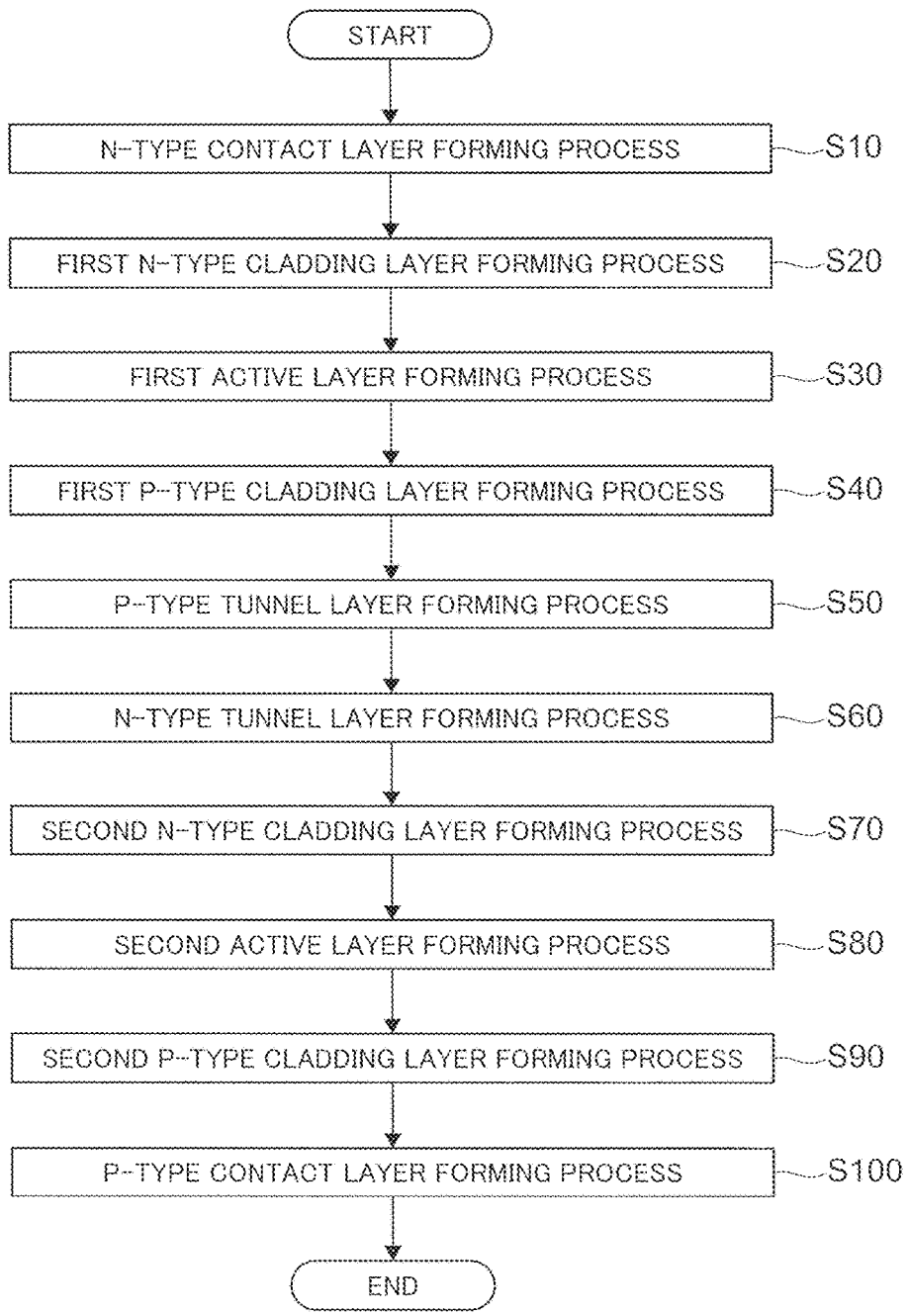
FIG. 3 is a flowchart illustrating a method for manufacturing the semiconductor layer forming substrate.

FIG. 3 is a flowchart illustrating a method for manufacturing the semiconductor layer forming substrate 1 as shown in FIG. 1. Note that the semiconductor layer forming substrate 1 of the exemplary embodiment is obtained by forming the light-emitting element layer 10 on the growth substrate 1a using a metal organic chemical vapor deposition (MOCVD) method. However, the method for manufacturing the semiconductor layer forming substrate 1 is not limited to this; for example, a molecular beam epitaxy (MBE) method may be used.

[N-Type Contact Layer Forming Process]

First, material gases of elements constituting the n-type contact layer 11 (a group III element, a group V element, and an element constituting the n-type impurities) as well as a carrier gas are supplied into a chamber accommodating the growth substrate 1a (step 10). In step 10, the n-type contact layer 11 is laminated on the growth substrate 1a.

[First n-Type Cladding Layer Forming Process]

Then, with the carrier gas being continuously supplied, material gases of elements constituting the first n-type cladding layer 121 (a group III element, a group V element, and an element constituting the n-type impurities) are supplied into the chamber accommodating the growth substrate 1a, on which the n-type contact layer 11 has been laminated (step 20). In step 20, the first n-type cladding layer 121 is laminated on the n-type contact layer 11.

[First Active Layer Forming Process]

Then, with the carrier gas being continuously supplied, material gases of elements constituting the first well layers 1221 (a group III element and a group V element) and material gases of elements constituting the first barrier layers 1222 (a group III element and a group V element) are alternately supplied into the chamber accommodating the growth substrate 1a, on which the layers up to the first n-type cladding layer 121 have been laminated (step 30). In step 30, the first active layer 122 composed of the alternately laminated first well layers 1221 and first barrier layers 1222 is formed on the first n-type cladding layer 121.

[First p-Type Cladding Layer Forming Process]

With the carrier gas being continuously supplied, material gases of elements constituting the first p-type cladding layer 123 (a group III element, a group V element, and an element constituting the p-type impurities) are supplied into the chamber accommodating the growth substrate 1a, on which the layers up to the first active layer 122 have been laminated (step 40). In step 40, the first p-type cladding layer 123 is laminated on the first active layer 122.

Through the above processes, the first light-emitting layer 12 is formed on the n-type contact layer 11.

[P-Type Tunnel Layer Forming Process]

Then, with the carrier gas being continuously supplied, material gases of elements constituting the p-type tunnel layer 131 (a group III element, a group V element, and an element constituting the p-type impurities) are supplied into the chamber accommodating the growth substrate 1a, on which the layers up to the first p-type cladding layer 123 have been laminated (step 50). In step 50, the p-type tunnel layer 131 is laminated on the first p-type cladding layer 123.

[N-Type Tunnel Layer Forming Process]

Then, with the carrier gas being continuously supplied, material gases of elements constituting the n-type tunnel layer 133 (a group III element, a group V element, and an element constituting the n-type impurities) are supplied into the chamber accommodating the growth substrate 1a, on which the layers up to the p-type tunnel layer 131 have been laminated (step 60). In step 60, the n-type tunnel layer 133 is laminated on the p-type tunnel layer 131.

Here, when the processing goes from step 50 to step 60, the exemplary embodiment uses a devised method for supplying the material gases into the chamber. This method enables to form, between the p-type tunnel layer 131 and the n-type tunnel layer 133, the highly n-type impurities-doped layer 132 having a higher concentration of n-type impurities than the n-type tunnel layer 133. Details of the method will be described in later.

Through the above processes, the tunnel junction layer 13 is formed on the first light-emitting layer 12.

[Second n-Type Cladding Layer Forming Process]

Then, with the carrier gas being continuously supplied, material gases of elements constituting the second n-type cladding layer 141 (a group III element, a group V element, and an element constituting the n-type impurities) are supplied into the chamber accommodating the growth substrate 1a, on which the layers up to the n-type tunnel layer 133 have been laminated (step 70). In step 70, the second n-type cladding layer 141 is laminated on the n-type tunnel layer 133.

[Second Active Layer Forming Process]

Subsequently, with the carrier gas being continuously supplied, material gases of elements constituting the second well layers 1421 (a group III element and a group V element) and material gases of elements constituting the second barrier layers 1422 (a group III element and a group V element) are alternately supplied into the chamber accommodating the growth substrate 1a, on which the layers up to the second n-type cladding layer 141 have been laminated (step 80). In step 80, the second active layer 142 composed of the alternately laminated second well layers 1421 and second barrier layers 1422 is formed on the second n-type cladding layer 141.

[Second p-Type Cladding Layer Forming Process]

Then, with the carrier gas being continuously supplied, material gases of elements constituting the second p-type cladding layer 143 (a group III element, a group V element, and an element constituting the p-type impurities) are supplied into the chamber accommodating the growth substrate 1a, on which the layers up to the second active layer 142 have been laminated (step 90). In step 90, the second p-type cladding layer 143 is laminated on the second active layer 142.

Through the above processes, the second light-emitting layer 14 is formed on the tunnel junction layer 13.

[P-Type Contact Layer Forming Process]

Finally, with the carrier gas being continuously supplied, material gases of elements constituting the p-type contact layer 15 (a group III element, a group V element, and an element constituting the p-type impurities) are supplied into the chamber accommodating the growth substrate 1a, on which the layers up to the second p-type cladding layer 143 have been laminated (step 100). In step 100, the p-type contact layer 15 is laminated on the second p-type cladding layer 143.

Through the above processes, the semiconductor layer forming substrate 1 is obtained that consists of the n-type contact layer 11, the first light-emitting layer 12, the tunnel junction layer 13, the second light-emitting layer 14 and the p-type contact layer 15 laminated in this order on the growth substrate 1a.

<Method for Manufacturing the Tunnel Junction Layer>

Now, the method for manufacturing the tunnel junction layer 13, which is a part of the aforementioned method for manufacturing the semiconductor layer forming substrate 1, will be described in more detail.

Figure 4:
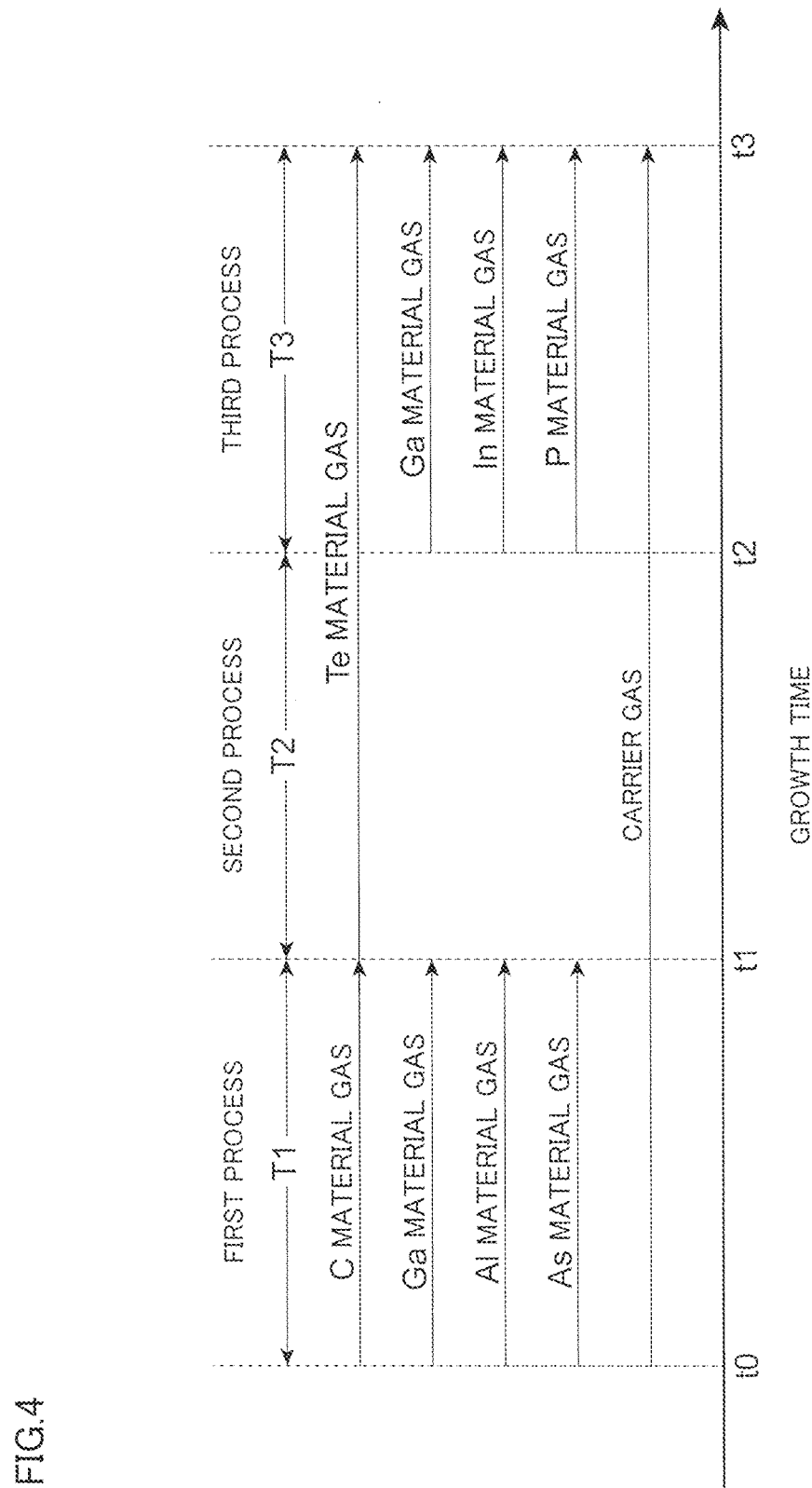
FIG. 4 is a timing chart illustrating a method for manufacturing the tunnel junction layer.

FIG. 4 is a timing chart illustrating the method for manufacturing the tunnel junction layer 13. In FIG. 4, the horizontal axis represents elapse of time (referred to as "growth time" in the figure). Also, FIG. 4 shows the relationship between three processes (the first to the third processes) performed in manufacturing the tunnel junction layer 13 and material gases supplied into the chamber in the respective processes. Here, the first process corresponds to step 50 in FIG. 3 and the third process corresponds to step 60 in FIG. 3.

Note that the explanation herein is given using an example where the p-type tunnel layer 131 is composed of AlGaAs, the highly n-type impurities-doped layer 132 and the n-type tunnel layer 133 are composed of GaInP, the p-type impurities are C, and the n-type impurities are Te.

As described above, the tunnel junction layer 13 of the exemplary embodiment is formed by the MOCVD method. Note that the explanation is given assuming that hydrogen ($H_2$) is a carrier gas, tetrabromomethane ($CBr_4$) is a C material gas, trimethylgallium (TMG) is a Ga material gas, trimethylaluminium (TMAl) is an Al material gas, arsine ($AsH_3$) is an As material gas, diethyltellurium (DETe) is a Te material gas, trimethylindium (TMIn) is an In material gas, and phosphine ($PH_3$) is a P material gas.

[Pre-Processes Before the First Process]

In the pre-processes before the first process, namely in steps 10 to 40 shown in FIG. 3, a temperature (a substrate temperature) of the growth substrate 1a inside the chamber is set to the first growth temperature (e.g. about 650° C.). At the start of the first process after finishing the pre-processes (specifically step 40), the substrate temperature is set to the second growth temperature that is lower than the first growth temperature by 100° C. to 150° C. (e.g. 500° C.). Note that the substrate temperature is maintained at the second growth temperature throughout the first to the third processes.

[First Process]

In the first process, the carrier gas and the various material gases for the p-type tunnel layer 131 are supplied into the chamber. The material gases are the C material gas (including an element constituting the p-type impurities; corresponds to the third material gas), the Ga material gas (including a group III element; corresponds to the first material gas), the Al material gas (including a group III element; corresponds to the first material gas), and the As material gas (including a group V element; corresponds to the second material gas).

The first process is performed during the first period T1 that runs from the first process start time t0 to the first process end time t1.

[Second Process]

In the second process subsequent to the first process, supply of the various material gases for the p-type tunnel layer 131, which have been supplied in the first process, is stopped, and the carrier gas and the Te material gas (including an element constituting the n-type impurities; corresponds to the fourth material gas) are supplied into the chamber.

The second process is performed during the second period T2 that runs from the first process end time (the second process start time) t1 to the second process end time t2. In the exemplary embodiment, the second period T2 is preferably shorter than the first period T1.

[Third Process]

In the third process subsequent to the second process, the carrier gas and the various material gases for the highly n-type impurities-doped layer 132 and the n-type tunnel layer 133 are supplied into the chamber. The material gases are the Te material gas (including an element constituting the n-type impurities; corresponds to the fourth material gas), the Ga material gas (including a group III element; corresponds to the fifth material gas), the In material gas (including a group III element; corresponds to the fifth material gas), and the P material gas (including a group V element; corresponds to the sixth material gas).

The third process is performed during the third period T3 that runs from the second process end time (the third process start time) t2 to the third process end time t3. In the exemplary embodiment, the third period T3 is preferably longer than the second period T2.

[Post-Processes after the Third Process]

In the post-processes after the third process, namely in steps 70 to 100 shown in FIG. 3, the temperature (the substrate temperature) of the growth substrate 1a inside the chamber is set to the first growth temperature (e.g. about 650° C.). Accordingly, at the start of step 70 after finishing the third process (specifically step 60), the substrate temperature is reset to the first growth temperature (e.g. about 650° C.) that is higher than the second growth temperature by 100° C. to 150° C.

In the first to the third processes, the growth temperature is made lower than that in the pre- and post-processes (the pre-processes before the first process and the post-processes after the third process). This is done to dope the tunnel junction layer 13 with a larger amount of impurities (p-type impurities or n-type impurities) than the other layers.

<Structure of the Semiconductor Light-Emitting Element>

Figure 5:
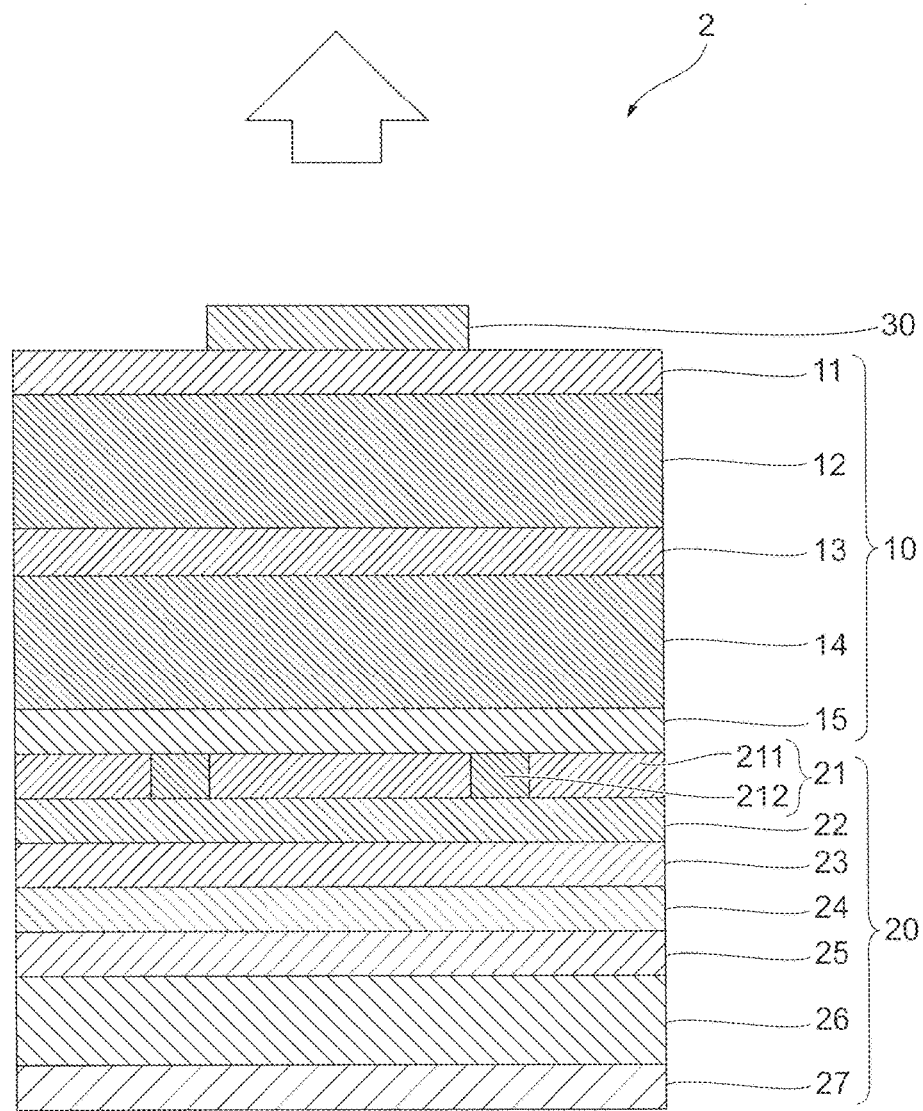
FIG. 5 is a diagram illustrating a cross-sectional structure of a semiconductor light-emitting element including a light-emitting element layer.

FIG. 5 is a diagram illustrating a cross-sectional structure of a semiconductor light-emitting element 2 including the light-emitting element layer 10. As shown in the FIG. 5, the semiconductor light-emitting element 2 includes the light-emitting element layer 10, but does not include the growth substrate 1a, which constitutes the semiconductor layer forming substrate 1 together with the light-emitting element layer 10.

The semiconductor light-emitting element 2 includes: the aforementioned light-emitting element layer 10; the positive electrode portion 20 connected to the p-type contact layer 15 of the light-emitting element layer 10; and the negative electrode portion 30 connected to the n-type contact layer 11 of the light-emitting element layer 10. The positive electrode portion 20 functions as a p-electrode of the first light-emitting layer 12 and the second light-emitting layer 14 of the light-emitting element layer 10. On the other hand, the negative electrode portion 30 functions as an n-electrode of the first light-emitting layer 12 and the second light-emitting layer 14 of the light-emitting element layer 10. The positive electrode portion 20 further functions as a reflection film by which light emitted from the first light-emitting layer 12 and the second light-emitting layer 14 to the positive electrode portion 20 side is reflected toward the negative electrode portion 30 side. The positive electrode portion 20 is formed on the almost entire surface of the lower side (in the figure) of each semiconductor light-emitting element 2. On the other hand, the native electrode portion 30 is formed in an island shape on a part of the upper side (in the figure) of each semiconductor light-emitting element 2.

[Positive Electrode Portion]

The positive electrode portion 20 includes: a p-electrode layer 21 laminated on the p-type contact layer 15 of the light-emitting element layer 10; a reflection layer 22 laminated on the p-electrode layer 21; and a diffusion preventing layer 23 laminated on the reflection layer 22. The positive electrode portion 20 further includes: a joining layer 24 laminated on the diffusion preventing layer 23; an internal electrode layer 25 laminated on the joining layer 24; a support substrate 26 laminated on the internal electrode layer 25; and an external electrode layer 27 laminated on the support substrate 26 and exposed to the outside.

(P-Electrode Layer)

The p-electrode layer 21 is for supplying a current to the first light-emitting layer 12 and the second light-emitting layer 14 of the light-emitting element layer 10 by diffusing it in a surface direction. The p-electrode layer 21 includes: a light-transmitting layer 211 with plural through holes penetrating in the thickness direction; and plural columnar electrode layers 212 filling the respective through-holes.

[Light-Transmitting Layer]

The light-transmitting layer 211 has insulation properties and transmits light emitted from the first light-emitting layer 12 and the second light-emitting layer 14 of the light-emitting element layer 10. The light-transmitting layer 211 may be made of $SiO_2$ or the like.

[Columnar Electrode Layer]

The columnar electrode layer 212 has conductivity and makes ohmic contact with the p-type contact layer 15 of the light-emitting element layer 10. The columnar electrode layer 212 may be made of AuBe or the like.

(Reflection Layer)

The reflection layer 22 has conductivity and reflects light emitted from the first light-emitting layer 12 and the second light-emitting layer 14 of the light-emitting element layer 10. The reflection layer 22 may be made of an AgPdCu (APC) alloy, a metal such as Au, Cu, Ag, Al or Pt, or an alloy of these metals or the like.

(Diffusion Preventing Layer)

The diffusion preventing layer 23 has conductivity and prevents metals contained in the joining layer 24, the support substrate 26 and the like from diffusing to the reflection layer 22 side and reacting with the reflection layer 22. The diffusion preventing layer 23 may be made of a metal such as Ni, Ti, Pt, Cr, Ta, W or Mo. Alternatively, the diffusion preventing layer 23 may be formed by laminating plural metal layers of metals selected from the above metals.

(Joining Layer)

The joining layer 24 has conductivity and joins the diffusion preventing layer 23 formed above the light-emitting element layer 10 and the internal electrode layer 25 formed on the support substrate 26. The joining layer 24 may be made of an Au-based eutectic metal or the like, which is chemically stable and has a low melting point. Examples of the Au-based eutectic metal include AuGe, AuSn, AuSi and AuIn.

(Internal Electrode Layer)

The internal electrode layer 25 has conductivity and electrically connects the joining layer 24 and the support substrate 26. The internal electrode layer 25 may be made of a metal material of various kinds, or may be formed by laminating plural metal layers.

(Support Substrate)

The support substrate 26 has conductivity and physically supports the light-emitting element layer 10, which is obtained by removing the growth substrate 1a from the semiconductor layer forming substrate 1. In this example, the reflection layer 22 is arranged between the light-emitting element layer 10 (the first light-emitting layer 12 and the second light-emitting layer 14) and the support substrate 26. For this reason, the support substrate 26 may be made of a material that absorbs light emitted from the first light-emitting layer 12 and the second light-emitting layer 14. The support substrate 26 may be a Ge wafer, an Si wafer, a GaAs wafer, a GaP wafer or the like.

(External Electrode Layer)

The external electrode layer 27 has conductivity and is electrically connected to the wiring (not shown) provided outside. The external electrode layer 27 may be made of a metal material of various kinds, or may be formed by laminating plural metal layers.

[Negative Electrode Portion]

The negative electrode portion 30 may be made of a metal of various kinds, or may be formed by laminating plural metal layers.

<Method for Manufacturing the Semiconductor Light-Emitting Element>

Now, the method for manufacturing the semiconductor light-emitting element 2 shown in FIG. 5 will be described using a specific example.

Figure 6:
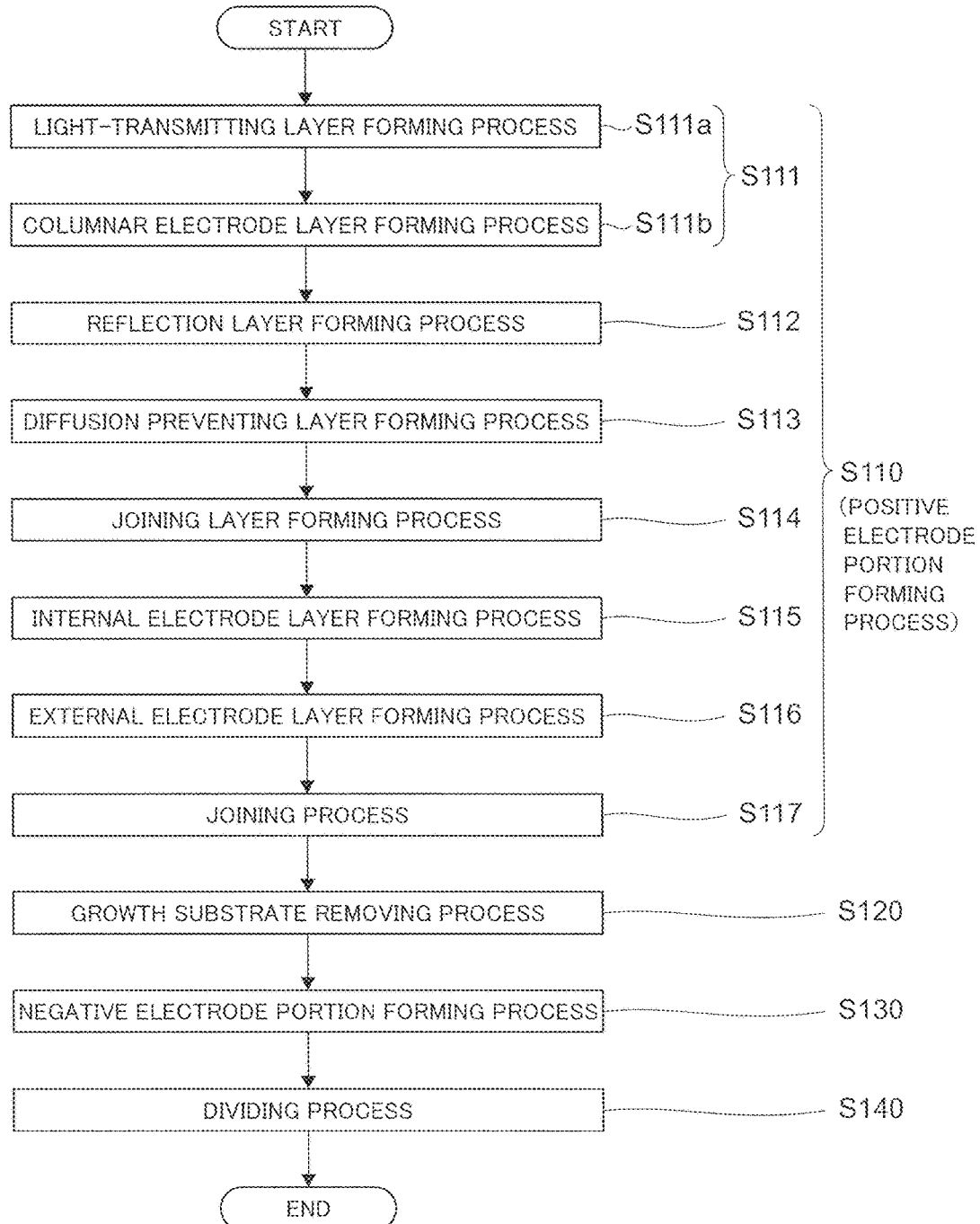
FIG. 6 is a flowchart illustrating a method for manufacturing the semiconductor light-emitting element.

FIG. 6 is a flowchart illustrating the method for manufacturing the semiconductor light-emitting element 2.

[Positive Electrode Portion Forming Process]

First, the positive electrode portion 20 is formed on the p-type contact layer 15 of the semiconductor layer forming substrate 1 including the growth substrate 1a and the light-emitting element layer 10 (step 110). The positive electrode portion forming process of step 110 includes plural processes (steps 111 to 117 in this example) explained below.

(P-Electrode Layer Forming Process)

In the positive electrode portion forming process of step 110, first, the p-electrode layer 21 is formed on the p-type contact layer 15 of the light-emitting element layer 10 (step 111). Note that, in the p-electrode layer forming process of step 111, the light-transmitting layer 211 is formed first (step 111a), and then the columnar electrode layers 212 are formed (step 111b).

[Light-Transmitting Layer Forming Process]

In the light-transmitting layer forming process of step 111a, $SiO_2$ is deposited on the entire surface of the p-type contact layer 15 by chemical vapor deposition (CVD), and the $SiO_2$ is then etched to make plural through holes in the positions in which the respective columnar electrode layers 212 are to be formed. At this time, the thickness of the $SiO_2$ is set at approximately 0.3 µm. The light-transmitting layer 211 made of $SiO_2$ is thus obtained.

[Columnar Electrode Layer Forming Process]

In the columnar electrode layer forming process of step 111b, AuBe is filled into each of the through holes in the light-transmitting layer 211 by vapor deposition to form plural columnar electrode layers 212. The thickness of the AuBe is made equal to the thickness of the light-transmitting layer 211. The p-electrode layer 21 including the light-transmitting layer 211 and the plural columnar electrode layers 212 is thus obtained.

(Reflection Layer Forming Process)

Then, Au is deposited on the p-electrode layer 21 by vapor deposition to form the reflection layer 22 (step 112). The thickness of the reflection layer 22 is set at approximately 0.7 µm.

(Diffusion Preventing Layer Forming Process)

Subsequently, Pt and Ti are deposited in this order on the reflection layer 22 by vapor deposition to form the diffusion preventing layer 23 with a lamination structure of a Pt layer and a Ti layer (step 113). The thickness of the diffusion preventing layer 23 is set at approximately 0.5 µm.

(Joining Layer Forming Process)

Then, AuGe is deposited on the diffusion preventing layer 23 by vapor deposition to form the joining layer 24 (step 114). The thickness of the joining layer 24 is set at approximately 1.0 µm. At this moment, the p-electrode layer 21, the reflection layer 22, the diffusion preventing layer 23 and the joining layer 24 are laminated on the p-type contact layer 15 of the light-emitting element layer 10 of the semiconductor layer forming substrate 1 including the growth substrate 1a. Hereinafter, the structure formed by laminating the p-electrode layer 21, the reflection layer 22, the diffusion preventing layer 23 and the joining layer 24 on the semiconductor layer forming substrate 1 is referred to as the "first laminated body".

(Internal Electrode Layer Forming Process)

Besides the above first laminated body, the support substrate 26 made of a Ge wafer is prepared. Pt and Au are deposited in this order on one surface (front surface) of the support substrate 26 by vapor deposition to form the internal electrode layer 25 with a lamination structure of a Pt layer and an Au layer (step 115). The thicknesses of the Pt layer and the Au layer of the internal electrode layer 25 are set at approximately 0.1 µm and approximately 0.5 µm, respectively.

(External Electrode Layer Forming Process)

Then, Pt and Au are deposited in this order on the other surface (rear surface) of the support substrate 26 by vapor deposition to form the external electrode layer 27 with a lamination structure of a Pt layer and an Au layer (step 116). The thicknesses of the Pt layer and the Au layer of the external electrode layer 27 are set at approximately 0.1 µm and approximately 0.5 µm, respectively. At this moment, the internal electrode layer 25 and the external electrode layer 27 are laminated on the front surface and the rear surface of the support substrate 26, respectively. Hereinafter, the structure formed by laminating the internal electrode layer 25 and the external electrode layer 27 on the support substrate 26 is referred to as the "second laminated body".

(Joining Process)

The joining layer 24 of the first laminated body and the internal electrode layer 25 of the second laminated body are brought into face-to-face contact with each other. In this state, the first laminated body and the second laminated body are heated and pressurized to be joined with each other (step 117). The heating temperature is set at approximately 400° C. and the applied pressure is set at approximately 500 kgf. At this moment, the semiconductor layer forming substrate 1 including the growth substrate 1a and the light-emitting element layer 10, and the positive electrode portion 20 are laminated. Hereinafter, the structure formed by laminating the semiconductor layer forming substrate 1 and the positive electrode portion 20 is referred to as the "third laminated body".

Thus, the positive electrode portion forming process of step 110 is finished.

[Growth Substrate Removing Process]

Subsequently, the third laminated body is wet-etched to separate the growth substrate 1a and the light-emitting element layer 10 of the semiconductor layer forming substrate 1, removing the growth substrate 1a from the third laminated body (step 120). At this moment, the light-emitting element layer 10 and the positive electrode portion 20 are laminated with the n-type contact layer 11 of the light-emitting element layer 10 being exposed to the outside. Hereinafter, the structure formed by laminating the light-emitting element layer 10 and the positive electrode portion 20 is referred to as the "fourth laminated body".

[Negative Electrode Portion Forming Process]

Next, plural negative electrode portions 30 are formed on the n-type contact layer 11 of the light-emitting element layer 10 in the fourth laminated body (step 130). In this example, an AuGe—Ni alloy, Ti and Au are deposited in this order on the n-type contact layer 11. This forms the negative electrode portion 30 composed of an AuGe—Ni alloy layer, a Ti layer and an Au layer laminated in this order. The thicknesses of the AuGe—Ni alloy layer, the Ti layer and the Au layer of the negative electrode portion 30 are set at approximately 0.5 µm, approximately 0.2 µm and approximately 1.0 µm, respectively. At this moment, the plural negative electrode portions 30 are arranged in a matrix on the surface of the n-type contact layer 11 of the light-emitting element layer 10, which is one of the surfaces of the fourth laminated body consisting of the light-emitting element layer 10 and the positive electrode portion 20. Hereinafter, the structure formed by laminating the positive electrode portion 20 and the plural negative electrode portions 30 on the light-emitting element layer 10 is referred to as the "fifth laminated body".

[Dividing Process]

Finally, the fifth laminated body is wet-etched and irradiated with laser, so that the fifth laminated body is divided into plural semiconductor light-emitting elements 2 (step 140). The dividing process of step 140 is performed such that each individual light-emitting element 2 includes one negative electrode portion 30.

Through the above processes, the semiconductor light-emitting elements 2 each including the light-emitting element layer 10, the positive electrode portion 20 and the negative electrode portion 30 are obtained.

<Light Emission Operation of the Semiconductor Light-Emitting Element>

Now, light emission operation of the semiconductor light-emitting element 2 thus obtained will be explained.

In response to a forward voltage being applied to the positive electrode portion 20 and the negative electrode portion 30 of the semiconductor light-emitting element 2, a current (a forward current) passes through the light-emitting element layer 10 in a direction from the p-type contact layer 15 to the n-type contact layer 11. In the exemplary embodiment, the first light-emitting layer 12 and the second light-emitting layer 14 are connected via the tunnel junction layer 13, which makes the flow of the forward current less interrupted.

In response to the forward current passing through the first light-emitting layer 12 and the second light-emitting layer 14, the first light-emitting layer 12 and the second light-emitting layer 14 each emit light of the same wavelength. The light emitted from the first light-emitting layer 12 is mostly directed toward the n-type contact layer 11 side (the upper side in FIG. 5) and the tunnel junction layer 13 side (the lower side in FIG. 5). On the other hand, the light emitted from the second light-emitting layer 14 is mostly directed toward the tunnel junction layer 13 side (the upper side in FIG. 5) and the p-type contact layer 15 side (the lower side in FIG. 5).

Here, the light emitted from the first light-emitting layer 12 and the second light-emitting layer 14 toward the upper side in FIG. 5 is outputted to the outside via the n-type contact layer 11 (refer to an arrow in the figure). On the other hand, the light emitted from the first light-emitting layer 12 and the second light-emitting layer 14 toward the lower side in FIG. 5 is reflected by the reflection layer 22 and goes toward the n-type contact layer 11 side (the upper side in FIG. 5).

Meanwhile, the light emitted from the first light-emitting layer 12 and the second light-emitting layer 14 passes through the tunnel junction layer 13 in the light-emitting element layer 10. Here, in the exemplary embodiment, the n-type tunnel layer 133 of the tunnel junction layer 13 is composed of a group III-V semiconductor containing P (a phosphide). This enables to make the band gap of the n-type tunnel layer 133 larger than one that is composed of a group III-V semiconductor containing As (an arsenide). As a result, the light emitted from the first light-emitting layer 12 and the second light-emitting layer 14 is less absorbed by the n-type tunnel layer 133, which can increase the emission output of the light-emitting element layer 10, and ultimately the semiconductor light-emitting element 2.

Further, in the exemplary embodiment, the highly n-type impurities-doped layer 132 is arranged at the boundary between the p-type tunnel layer 131 and the n-type tunnel layer 133 of the tunnel junction layer 13. This lowers the resistance of the tunnel junction layer 13 in accordance with an increase in carriers, allowing for preventing an increase in the forward voltage in the semiconductor light-emitting element 2.

Further, in the exemplary embodiment, the light-emitting element layer 10 is manufactured at the growth temperature of 650° C. to 700° C. for the first light-emitting layer 12 and the second light-emitting layer 14, and at the growth temperature lower than the above temperature by 100° C. to 150° C. for the tunnel junction layer 13. For example, in a case where GaInP is formed using a MOCVD method, the PL peak energy (nearly equal to the band gap) of GaInP becomes minimum at the growth temperature of 650° C., and becomes larger above or below 650° C. For this reason, if the tunnel junction layer 13 is formed at the growth temperature below 650° C., transparency of the tunnel junction layer 13 to the light emitted from the first light-emitting layer 12 and the second light-emitting layer 14 is expected to increase.

<Others>

Although the exemplary embodiment has been explained using the example where the two light-emitting layers (the first light-emitting layer 12 and the second light-emitting layer 14) are connected via the single tunnel junction layer 13, the present invention is not limited to this structure. For example, more than two light-emitting layers and more than one tunnel junction layer 13 may be alternately connected.

Although in the exemplary embodiment the first active layer 122 of the first light-emitting layer 12 and the second active layer 142 of the second light-emitting layer 14 each have a so-called multi-quantum well structure, the present invention is not limited to this structure. For example, these active layers may have a so-called single quantum well structure, or may have a simple double heterojunction structure.

Although the exemplary embodiment has been explained using the example where the semiconductor light-emitting element 2 including the light-emitting element layer 10 is provided with the reflection layer 22, the structure of the semiconductor light-emitting element 2 may be changed as appropriate.

Although in the exemplary embodiment the highly n-type impurities-doped layer 132 is arranged between the p-type tunnel layer 131 and the n-type tunnel layer 133 of the tunnel junction layer 13, the highly n-type impurities-doped layer 132 is not essential. That is, the tunnel junction layer 13 may be composed of the p-type tunnel layer 131 and the n-type tunnel layer 133 directly laminated on each other.

EXAMPLES

Hereinafter, the present invention will be described in more detail based on the Examples. However, it should be noted that the present invention is not limited to the Examples below as long as the gist of the present invention is maintained.

The inventors manufactured semiconductor layer forming substrates 1 each having a tunnel junction layer 13 of a different composition. The inventors then evaluated various properties of semiconductor light-emitting elements 2 obtained from the respective semiconductor layer forming substrates 1.

Table 1 shows conditions for manufacturing the semiconductor layer forming substrate 1 of the Example 1. Table 2 shows relationship between the tunnel junction layers of the semiconductor layer forming substrates 1 of the Examples 1 to 3 and the Comparative Example.

TABLE 1

[EXAMPLE 1]

| | | | | | EMISSION WAVELENGTH 810 nm | | |
|---|---|---|---|---|---|---|---|
| | LAYER STRUCTURE | | | MATERIAL | DOPANT | CONCENTRATION ($/cm^3$) | THICKNESS ($\mu m$) |
| LIGHT EMITTING ELEMENT LAYER 10 | | P-TYPE CONTACT LAYER 15 | | AlGaAs | C | 3.0E+18 | 3.50 |
| | SECOND LIGHT EMITTING LAYER 14 | SECOND P-TYPE CLADDING LAYER 143 | | AlGaAs | C | 8.0E+17 | 0.20 |
| | | SECOND ACTIVE LAYER 142 | SECOND BARRIER LAYER 1422 | AlGaAsP | UN | — | 0.119(0.007 × 17) |
| | | | SECOND WELL LAYER 1421 | AlGaInAsP | UN | — | 0.0594(0.0033 × 18) |
| | | SECOND N-TYPE CLADDING LAYER 141 | | Al0.45Ga0.55As | Te | 1.0E+18 | 0.20 |
| | TUNNEL JUNCTION LAYER 13 | N-TYPE TUNNEL LAYER 133 | | Ga0.51In0.49P | Te | 2.5E+19 | 0.015 |
| | | P-TYPE TUNNEL LAYER 131 | | Al0.25Ga0.75As | C | 4.0E+19 | 0.020 |
| | FIRST LIGHT EMITTING LAYER 12 | FIRST P-TYPE CLADDING LAYER 123 | | Al0.45Ga0.55As | C | 8.0E+17 | 0.20 |
| | | FIRST ACTIVE LAYER 122 | FIRST BARRIER LAYER 1222 | AlGaAsP | UN | — | 0.119(0.007 × 17) |
| | | | FIRST WELL LAYER 1221 | AlGaInAsP | UN | — | 0.0594(0.0033 × 18) |
| | | FIRST N-TYPE CLADDING LAYER 121 | | AlGaAs | Te | 1.0E+18 | 0.20 |
| | N-TYPE CONTACT LAYER 11 | | | AlGaAs | Te | 5.0E+17 | 5.00 |
| | GROWTH SURSTRAT 1a | | | GaAs | Si | 1.0E+18 | 350 |

TABLE 2

| | MATERIAL OF P-TYPE TUNNEL LAYER 131 | MATERIAL OF N-TYPE TUNNEL LAYER 133 | HIGHLY N-TYPE IMPURITIES-DOPED LAYER 132 | IMPURITY CONCENTRATION IN P-TYPE TUNNEL LAYER 131 & N-TYPE TUNNEL LAYER 133 |
|---|---|---|---|---|
| EXAMPLE 1 | AlGaAs | GaInP | YES | CONSTANT |
| EXAMPLE 2 | AlGaAs | GaInP | YES | INCLINED |
| EXAMPLE 3 | AlGaAs | GaInP | NO | CONSTANT |
| COMPARATIVE EXAMPLE | AlGaAs | AlGaAs | YES | CONSTANT |

<Semiconductor Layer Forming Substrate of the Example 1>
Now, the semiconductor layer forming substrate 1 of the Example 1 will be explained with reference to Table 1.
[Growth Substrate]
As the growth substrate 1a, a wafer of GaAs single crystal added with an Si dopant, which is an n-type impurity, was used. Carrier concentration in the wafer was $1.0 \times 10^{18}$ (/cm$^3$) (described as "1.0E+18" in Table 1; the same applies hereafter). Here, carrier concentration in the growth substrate 1a is preferably selected from a range of $5.0 \times 10^{17}$ (/cm$^3$) to $2.0 \times 10^{18}$ (/cm$^3$). The thickness of the growth substrate 1a was set to 350 (μm), and the off-angle of the crystal growth plane on the growth substrate 1a was set to 15°.
[Light-Emitting Element Layer]
The light-emitting element layer 10 was configured as follows. Emission wavelength (as a design value) of the light-emitting element layer 10 (more specifically the first light-emitting layer 12 and the second light-emitting layer 14) was set to 810 nm.
(N-Type Contact Layer)
As the n-type contact layer 11, AlGaAs was used. The n-type contact layer 11 was added with a Te dopant, which is an n-type impurity, at a concentration of $5.0 \times 10^{17}$ (/cm$^3$). The thickness of the n-type contact layer 11 was set to 5.00 (μm).
(First Light-Emitting Layer)
The first light-emitting layer 12 was configured as follows.
[First n-Type Cladding Layer]
As the first n-type cladding layer 121, AlGaAs was used. The first n-type cladding layer 121 was added with a Te dopant, which is an n-type impurity, at a concentration of $1.0 \times 10^{18}$ (/cm$^3$). The thickness of the first n-type cladding layer 121 was set to 0.20 (μm).
[First Active Layer]
The first active layer 122 was configured as follows. Note that eighteen first well layers 1221 and seventeen first barrier layers 1222 were formed.
{First Well Layer}
As the first well layers 1221, AlGaInAsP was used. The first well layers 1221 were not added with a dopant (i.e. they were undoped; described as "UN" in Table 1; the same applies hereafter). The thickness of one first well layer 1221 was set to 0.0033 (μm). Accordingly, the total thickness of all (eighteen) first well layers 1221 was 0.0594 (μm).
{First Barrier Layer}
As the first barrier layers 1222, AlGaAsP was used. The first barrier layers 1222 were not added with a dopant (i.e. they were undoped). The thickness of one first barrier layer 1222 was set to 0.007 (μm). Accordingly, the total thickness of all (seventeen) first barrier layers 1222 was 0.119 (μm).
[First p-Type Cladding Layer]
As the first p-type cladding layer 123, $Al_{0.45}Ga_{0.55}As$ (described as "Al0.45Ga0.55As" in Table 1; the same applies hereafter) was used. The first p-type cladding layer 123 was added with a C dopant, which is a p-type impurity, at a concentration of $8.0 \times 10^{17}$ (/cm$^3$). The thickness of the first p-type cladding layer 123 was set to 0.20 (μm).
(Tunnel Junction Layer)
The tunnel junction layer 13 was configured as follows.
[P-Type Tunnel Layer]
As the p-type tunnel layer 131, $Al_{0.25}Ga_{0.75}As$ was used. The p-type tunnel layer 131 was added with a C dopant, which is a p-type impurity, at a concentration of $4.0 \times 10^{19}$ (/cm$^3$). The thickness of the p-type tunnel layer 131 was set to 0.020 (μm).

[N-Type Tunnel Layer]
As the n-type tunnel layer 133, $Ga_{0.51}In_{0.49}P$ was used. The n-type tunnel layer 133 was added with a Te dopant, which is an n-type impurity, at a concentration of $2.5 \times 10^{19}$ (/cm$^3$). The thickness of the n-type tunnel layer 133 was set to 0.015 (μm).
[Highly n-Type Impurities-Doped Layer]
In the Example 1, the tunnel junction layer 13 was manufactured according to the procedure shown in FIG. 4. Thus, the highly n-type impurities-doped layer 132 having a larger amount of Te as n-type impurities than the n-type tunnel layer 133 is present between the p-type tunnel layer 131 and the n-type tunnel layer 133 (details described later), although not shown in Table 1.
(Second Light-Emitting Layer)
The second light-emitting layer 14 was configured as follows. Note that each layer in the second light-emitting layer 14 was configured to have a structure that is common to each corresponding layer in the first light-emitting layer 12.
[Second n-Type Cladding Layer]
As the second n-type cladding layer 141, $Al_{0.45}Ga_{0.55}As$ was used. The second n-type cladding layer 141 was added with a Te dopant, which is an n-type impurity, at a concentration of $1.0 \times 10^{18}$ (/cm$^3$). The thickness of the second n-type cladding layer 141 was set to 0.20 (μm).
[Second Active Layer]
The second active layer 142 was configured as follows. Note that eighteen second well layers 1421 and seventeen second barrier layers 1422 were formed.
{Second Well Layer}
As the second well layers 1421, AlGaInAsP was used. The second well layers 1421 were not added with a dopant (i.e. they were undoped). The thickness of one second well layer 1421 was set to 0.0033 (μm). Accordingly, the total thickness of all (eighteen) second well layers 1421 was 0.0594 (μm).
{Second Barrier Layer}
As the second barrier layers 1422, AlGaAsP was used. The second barrier layers 1422 were not added with a dopant (i.e. they were undoped). The thickness of one second barrier layer 1422 was set to 0.007 (μm). Accordingly, the total thickness of all (seventeen) second barrier layers 1422 was 0.119 (μm).
[Second p-Type Cladding Layer]
As the second p-type cladding layer 143, AlGaAs was used. The second p-type cladding layer 143 was added with a C dopant, which is a p-type impurity, at a concentration of $8.0 \times 10^{17}$ (/cm$^3$). The thickness of the second p-type cladding layer 143 was set to 0.20 (μm).
(P-Type Contact Layer)
As the p-type contact layer 15, AlGaAs was used. The p-type contact layer 15 was added with a C dopant, which is a p-type impurity, at a concentration of $3.0 \times 10^{18}$ (/cm$^3$). The thickness of the p-type contact layer 15 was 3.50 (μm).
<Relationship Between the Semiconductor Layer Forming Substrates of the Examples and the Comparative Example>
Next, with reference to Table 2, relationship between the tunnel junction layers 13 of the semiconductor layer forming substrates 1 of the Examples (the Examples 1 to 3) and the Comparative Example will be explained. Table 2 shows materials of the p-type tunnel layer 131, materials of the n-type tunnel layer 133, existence or non-existence of the highly n-type impurities-doped layer 132, and the distribution of impurity concentration in each of the p-type tunnel layer 131 and the n-type tunnel layer 133.

First of all, materials of the p-type tunnel layer 131 will be explained. In the Examples 1 to 3 and the Comparative Example, the p-type tunnel layer 131 is made of AlGaAs.

Then, materials of the n-type tunnel layer 133 will be explained. In the Examples 1 to 3, the n-type tunnel layer 133 is made of GaInP. On the other hand, the n-type tunnel layer 133 of the Comparative Example is made of AlGaAs.

Then, existence or non-existence of the highly n-type impurities-doped layer 132 will be explained. In the Examples 1, 2 and the Comparative Example, the highly n-type impurities-doped layer 132 is provided (described as "YES" in Table 2). On the other hand, the highly n-type impurities-doped layer 132 is not provided in the Example 3 (described as "NO" in Table 2).

Finally, the distribution of impurity concentration in each of the p-type tunnel layer 131 and the n-type tunnel layer 133 will be explained. In the Examples 1, 3 and the Comparative Example, the impurity concentration in each of the p-type tunnel layer 131 and the n-type tunnel layer 133 is made constant (see the middle section (the first example) in FIG. 2). On the other hand, in the Example 2, the impurity concentration in each of the p-type tunnel layer 131 and the n-type tunnel layer 133 is inclined (see the lower section (the second example) in FIG. 2).

As explained above, the material of the n-type tunnel layer 133 is different between the Example 1 and the Comparative Example. Further, the distribution of impurity concentration in each of the p-type tunnel layer 131 and the n-type tunnel layer 133 is different between the Examples 1 and 2. Moreover, the highly n-type impurities-doped layer 132 is present in the Example 1 while the highly n-type impurities-doped layer 132 is not present in the Example 3.

<Semiconductor Light-Emitting Element>

With these semiconductor layer forming substrates 1 of the Examples 1 to 3 and the Comparative Example being used as a starting material, the semiconductor light-emitting element 2 was manufactured using the manufacturing method shown in FIG. 6. The semiconductor light-emitting element 2 thus obtained was subjected to various evaluations.

<Difference Due to the Material Constituting the n-Type Tunnel Layer>

Figure 7:
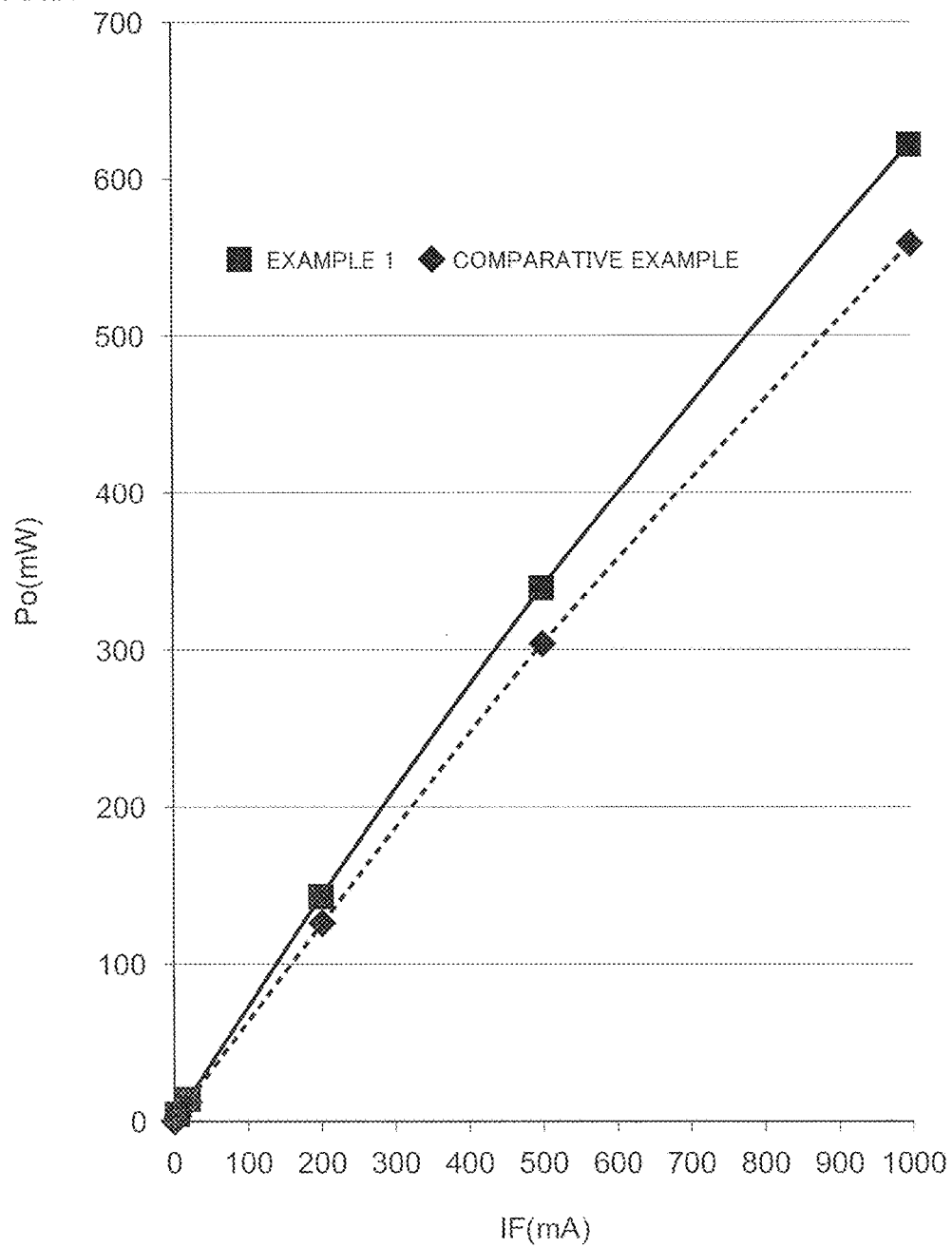
FIG. 7 is a diagram illustrating a relationship between a forward current and a light emission output of the semiconductor light-emitting elements of the Example 1 and the Comparative Example.

FIG. 7 shows a relationship between a forward current IF and a light emission output Po of the semiconductor light-emitting elements 2 of the Example 1 and the Comparative Example. In FIG. 7, the horizontal axis indicates the forward current IF (mA) and the vertical axis indicates the light emission output Po (mW).

It is understood from FIG. 7 that the light emission output Po of the semiconductor light-emitting element 2 of the Example 1 is improved by about 10% as compared to that of the semiconductor light-emitting element 2 of the Comparative Example. Note that the light emission output Po of the semiconductor light-emitting elements 2 of the Examples 2 and 3 is also improved as compared to that of the semiconductor light-emitting element 2 of the Comparative Example, although not shown in the figure.

From the above, it will be understood that the light emission output Po can be improved by composing the n-type tunnel layer 133 of the tunnel junction layer 13 of a phosphide (GaInP), instead of an arsenide (AlGaAs).

<Difference Due to Impurity Concentration Distribution>

Figure 8:
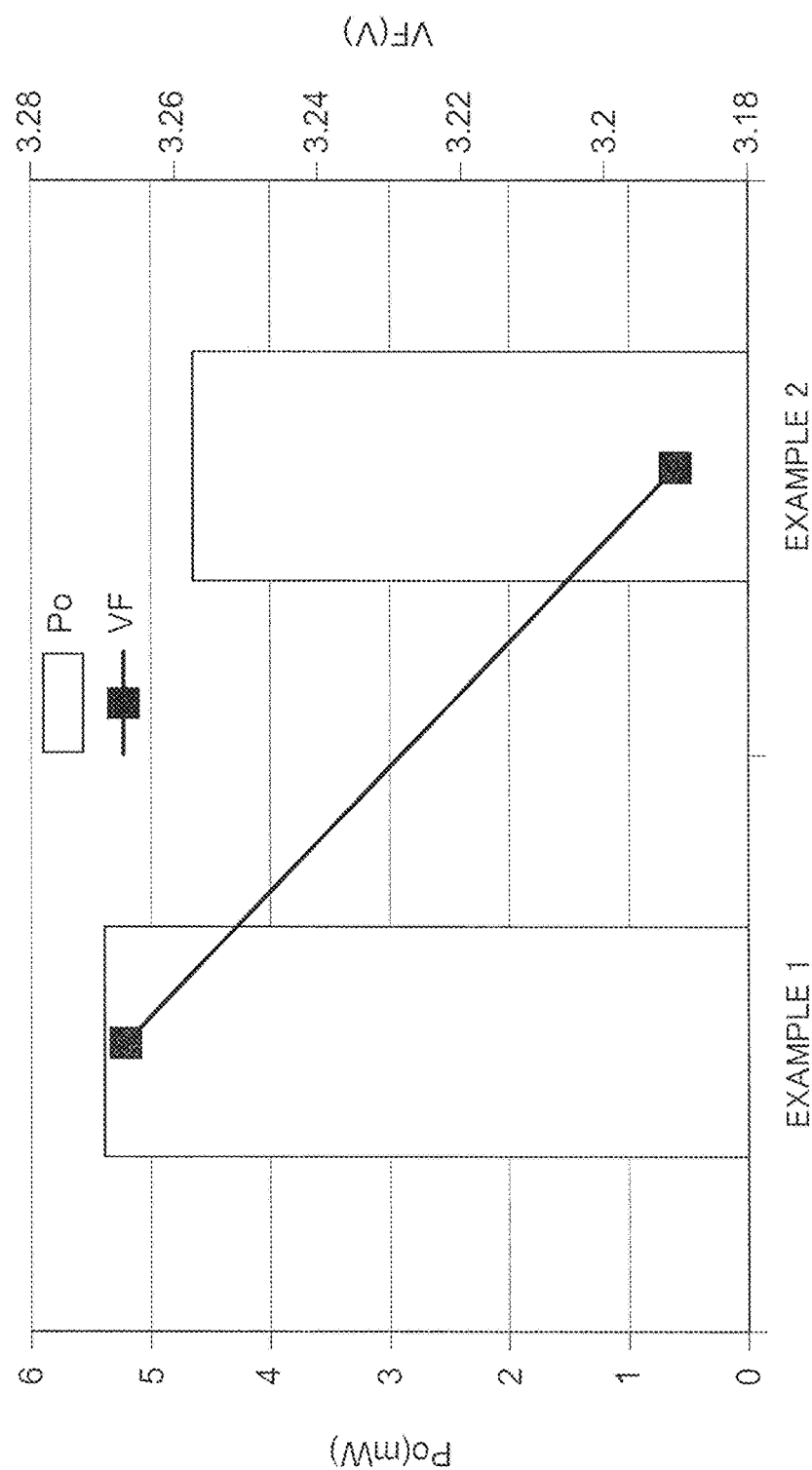
FIG. 8 is a diagram illustrating a relationship between a light emission output and a forward voltage of the semiconductor light-emitting elements of the Examples 1 and 2.

FIG. 8 shows a relationship between the light emission output Po and a forward voltage VF of the semiconductor light-emitting elements 2 of the Examples 1 and 2. Note that the light emission output Po and the forward voltage VF in the figure is a value when the forward current IF is 100 (mA).

It is understood from FIG. 8 that the forward voltage VF of the semiconductor light-emitting element 2 of the Example 2 is lower than that of the semiconductor light-emitting element 2 of the Example 1. However, it is also understood from the figure that the light emission output Po of the semiconductor light-emitting element 2 of the Example 2 is slightly lower than that of the semiconductor light-emitting element 2 of the Example 1.

From the above, it will be understood that the forward voltage VF can be reduced by inclining the impurity concentration distribution in each of the p-type tunnel layer 131 and the n-type tunnel layer 133 of the tunnel junction layer 13.

<Difference Due to Existence or Non-Existence of the Highly n-Type Impurities-Doped Layer>

Figure 9B:
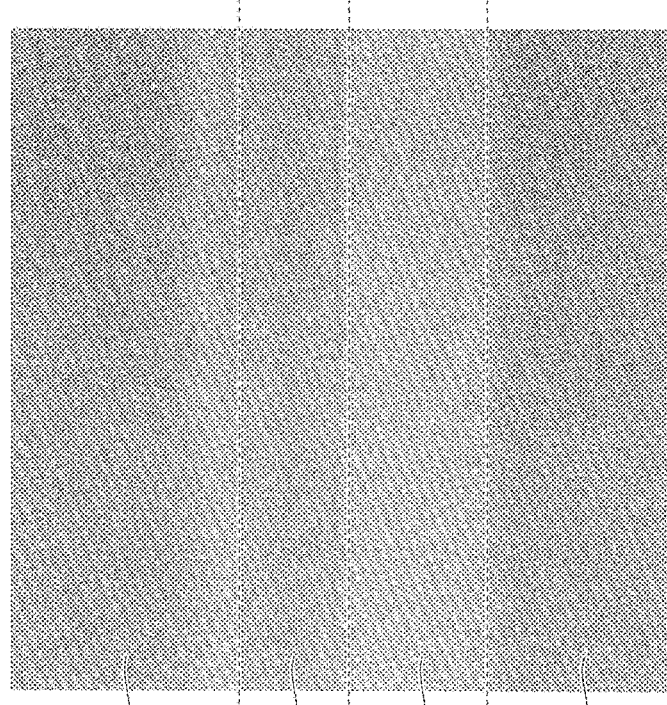
FIG. 9B is a TEM picture of the tunnel junction layer of the Example 3.
Figure 9A:
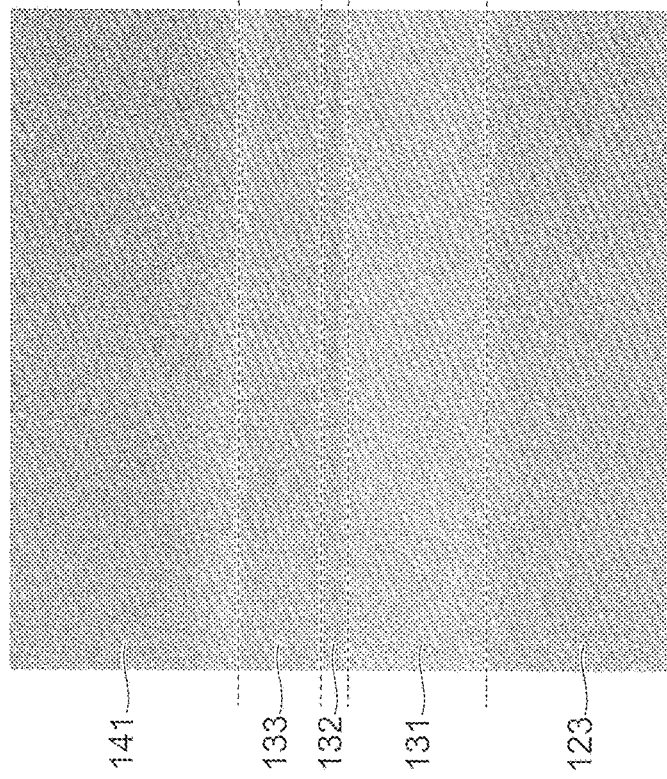
FIG. 9A is a TEM picture of the tunnel junction layer of the Example 1.

FIG. 9A is a TEM picture of the tunnel junction layer 13 of the Example 1, and FIG. 9B is a TEM picture of the tunnel junction layer 13 of the Example 3.

As shown in FIG. 9A, between the p-type tunnel layer 131 and the n-type tunnel layer 133 constituting the tunnel junction layer 13, another layer, namely the highly n-type impurities-doped layer 132 is thought to be present in the Example 1. On the other hand, as shown in FIG. 9B, the p-type tunnel layer 131 and the n-type tunnel layer 133 constituting the tunnel junction layer 13 seem to directly face each other in the Example 3; the highly n-type impurities-doped layer 132 is thought not to be present.

Figure 11:
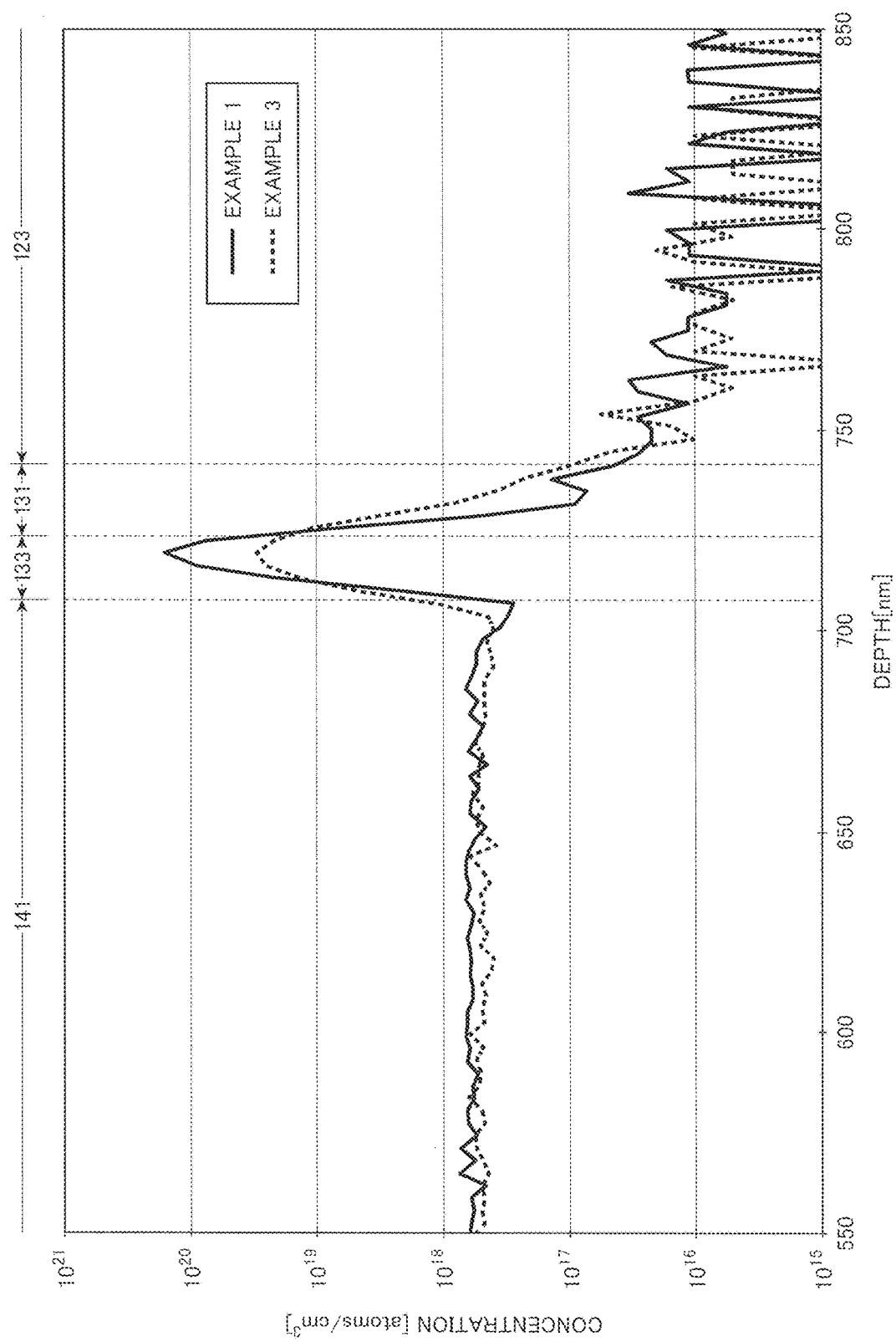
FIG. 11 is a diagram illustrating the results of secondary ion mass spectroscopy (SIMS) of the tunnel junction layers of the Examples 1 and 3.

FIG. 11 shows the results of secondary ion mass spectroscopy (SIMS) of the tunnel junction layers 13 of the Examples 1 and 3. The inventors used IMS 7f-Auto from CAMECA and carried out measurement using the dynamic SIMS (D-SIMS) mode, which analyzes a target sample while eroding its surface. In FIG. 11, the horizontal axis indicates depth (nm) and the vertical axis indicates concentration (atoms/cm$^3$) of the n-type impurities (Te in this example). FIG. 11 also shows the results of analysis on the first p-type cladding layer 123 and the second n-type cladding layer 141, which are present above and below the tunnel junction layer 13. FIG. 11 also shows a positional relationship between the first p-type cladding layer 123, the p-type tunnel layer 131, the n-type tunnel layer 133 and the second n-type cladding layer 141 estimated from the depth. Note that the positional relationship shown in the figure is merely a guide, and may be slightly different from the actual one.

In the Example 1, the maximum concentration of the n-type impurities was $1.6 \times 10^{20}$ (atoms/cm$^3$). On the other hand, in the Example 3, the maximum concentration of the n-type impurities was $3.0 \times 10^{19}$ (atoms/cm$^3$). In other words, the maximum concentration of the n-type impurities in the Example 1 was of the order of $10^{20}$ while that in the Example 3 was of the order of $10^{19}$.

FIG. 10 shows a relationship between the forward voltages VF of the semiconductor light-emitting elements 2 of the Examples 1 and 3. Similarly to FIG. 8, the forward voltage VF shown in the figure is a value when the forward current IF is 100 (mA).

It is understood from FIG. 10 that the semiconductor light-emitting element 2 of the Example 1 has a lower voltage VF than the semiconductor light-emitting element 2 of the Example 3.

From the above, it will be understood that the forward voltage VF can be reduced by providing, between the p-type tunnel layer forming process (step 50; the first process) and the n-type tunnel layer forming process (step 60; the third process), the process of supplying an n-type impurity material gas while stopping the supply of a group III material gas and a group V material gas (the second process). It will also be understood that the forward voltage VF can be reduced by providing the highly n-type impurities-doped layer 132 within the tunnel junction layer 13.

The foregoing description of the present exemplary embodiment of the present invention has been provided for the purposes of illustration and description. It is not intended to be exhaustive or to limit the invention to the precise forms disclosed. Obviously, many modifications and variations will be apparent to practitioners skilled in the art. The present exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

The invention claimed is:

1. A light-emitting diode comprising:
   a first light-emitting part including a first p-type layer, a first n-type layer, and a first active layer, the first p-type layer containing a compound semiconductor and p-type impurities, the first n-type layer containing a compound semiconductor and n-type impurities, the first active layer containing a compound semiconductor and being sandwiched between the first p-type layer and the first n-type layer;
   a second light-emitting part including a second p-type layer, a second n-type layer, and a second active layer, the second p-type layer containing a compound semiconductor and p-type impurities, the second n-type layer containing a compound semiconductor and n-type impurities, the second active layer containing a compound semiconductor and being sandwiched between the second p-type layer and the second n-type layer, the second light-emitting part emitting light of the same wavelength as the first light-emitting part; and
   a tunnel junction part including a third p-type layer and a third n-type layer, the third p-type layer facing the first p-type layer and containing $Al_xGa_{1-x}As$ ($0 \leq x \leq 0.3$) and p-type impurities, the third n-type layer facing the second n-type layer and containing $(Al_xGa_{1-x})_yIn_{1-y}P$ ($0 \leq x \leq 0.2$, $0.4 \leq y \leq 0.6$) and n-type impurities, the tunnel junction part being sandwiched between the first light-emitting part and the second light-emitting part, the third p-type layer and the third n-type layer forming a tunnel junction.

2. The light-emitting diode according to claim 1, wherein the tunnel junction part further includes a highly n-type impurities-doped layer at a boundary between the third p-type layer and the third n-type layer, the highly n-type impurities-doped layer containing n-type impurities at a higher concentration than the third n-type layer.

3. The light-emitting diode according to claim 2, wherein the highly n-type impurities-doped layer is thinner than the third n-type layer and the third p-type layer.

4. The light-emitting diode according to claim 2, wherein a concentration of the n-type impurities in the highly n-type impurities-doped layer is not less than $1 \times 10^{20}$ cm$^{-3}$ and not more than $1 \times 10^{21}$ cm$^{-3}$.

5. The light-emitting diode according to claim 1, wherein a concentration of the n-type impurities in the third n-type layer is higher at a side facing the third p-type layer than at a side facing the second n-type layer.

6. The light-emitting diode according to claim 1, wherein a concentration of the p-type impurities in the third p-type layer is higher at a side facing the third n-type layer than at a side facing the first p-type layer.

7. The light-emitting diode according to claim 1, wherein both of the first active layer and the second active layer have a single- or multi-quantum well structure including a well layer and a barrier layer,
   the well layer is composed of $(Al_xGa_{1-x})_yIn_{1-y}As_zP_{1-z}$ ($0 \leq x \leq 0.2$, $0.7 \leq y \leq 1.0$, $0.7 \leq z \leq 1.0$), and
   the barrier layer is composed of $Al_xGa_{1-x}As_zP_{1-z}$ ($0 \leq x \leq 0.3$, $0.7 \leq z \leq 1.0$).

8. The light-emitting diode according to claim 1, wherein each of the first p-type layer, the second p-type layer and the third p-type layer contains C as p-type impurities, and
   each of the first n-type layer, the second n-type layer and the third n-type layer contains Te as n-type impurities.

9. A light-emitting diode comprising:
   a first light-emitting part including a first p-type layer, a first n-type layer, and a first active layer, the first p-type layer containing Al, Ga, As and p-type impurities, the first n-type layer containing Al, Ga, As and n-type impurities, the first active layer containing a group III-V semiconductor and being sandwiched between the first p-type layer and the first n-type layer;
   a second light-emitting part including a second p-type layer, a second n-type layer, and a second active layer, the second p-type layer containing Al, Ga, As and p-type impurities, the second n-type layer containing Al, Ga, As and n-type impurities, the second active layer containing a group III-V semiconductor and being sandwiched between the second p-type layer and the second n-type layer, the second light-emitting part emitting light of the same wavelength as the first light-emitting part; and
   a tunnel junction part including a third p-type layer and a third n-type layer, the third p-type layer facing the first p-type layer and containing Ga, As and p-type impurities, the third n-type layer facing the second n-type layer and containing Ga, In, P and n-type impurities, the tunnel junction part being sandwiched between the first light-emitting part and the second light-emitting part, the third p-type layer and the third n-type layer forming a tunnel junction.

10. The light-emitting diode according to claim 9, wherein the third n-type layer has a larger band gap than the third p-type layer.

11. The light-emitting diode according to claim 9, wherein the first p-type layer and the second n-type layer have a common composition except for contained impurities.

12. The light-emitting diode according to claim 9, wherein each of the third p-type layer and the third n-type layer is composed of a direct band gap semiconductor.

13. The light-emitting diode according to claim 9, wherein a concentration of the n-type impurities in the third n-type layer is not less than $1 \times 10^{20}$ cm$^{-3}$ and not more than $1 \times 10^{21}$ cm$^{-3}$.

* * * * *